United States Patent
Wu et al.

(10) Patent No.: US 12,368,077 B2
(45) Date of Patent: Jul. 22, 2025

(54) SEMICONDUCTOR PACKAGE AND METHOD COMPRISING FORMATION OF REDISTRIBUTION STRUCTURE AND INTERCONNECTING DIE

(71) Applicant: Taiwan Semiconductor Manufacturing Co., Ltd., Hsinchu (TW)

(72) Inventors: Jiun Yi Wu, Zhongli (TW); Chen-Hua Yu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/446,748

(22) Filed: Aug. 9, 2023

(65) Prior Publication Data

US 2023/0386919 A1 Nov. 30, 2023

Related U.S. Application Data

(62) Division of application No. 17/412,625, filed on Aug. 26, 2021, now Pat. No. 11,848,234.

(51) Int. Cl.
*H01L 21/768* (2006.01)
*H01L 21/48* (2006.01)
(Continued)

(52) U.S. Cl.
CPC ...... *H01L 21/76895* (2013.01); *H01L 21/486* (2013.01); *H01L 21/561* (2013.01);
(Continued)

(58) Field of Classification Search
CPC . H01L 21/76895; H01L 21/486; H01L 24/05; H01L 24/19; H01L 24/32; H01L 24/33; H01L 24/94; H01L 25/0657; H01L 25/50; H01L 2224/32145; H01L 2924/181; H01L 25/0652; H01L 25/0655; H01L 21/568
(Continued)

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |

(Continued)

*Primary Examiner* — Didarul A Mazumder
(74) *Attorney, Agent, or Firm* — Slater Matsil, LLP

(57) ABSTRACT

In an embodiment, a structure includes a core substrate, a redistribution structure coupled to a first side of the core substrate, the redistribution structure including a plurality of redistribution layers, each of the plurality of redistribution layers comprising a dielectric layer and a metallization layer, and a first local interconnect component embedded in a first redistribution layer of the plurality of redistribution layers, the first local interconnect component including a substrate, an interconnect structure on the substrate, and bond pads on the interconnect structure, the bond pads of the first local interconnect component physically contacting a metallization layer of a second redistribution layer, the second redistribution layer being adjacent the first redistribution layer, the metallization layer of the second redistribution layer comprising first conductive vias, the dielectric layer of the first redistribution layer encapsulating the first local interconnect component.

20 Claims, 25 Drawing Sheets

(51) Int. Cl.
   *H01L 21/56* (2006.01)
   *H01L 23/00* (2006.01)
   *H01L 25/00* (2006.01)
   *H01L 25/065* (2023.01)

(52) U.S. Cl.
   CPC .............. *H01L 24/05* (2013.01); *H01L 24/19* (2013.01); *H01L 24/32* (2013.01); *H01L 24/33* (2013.01); *H01L 24/94* (2013.01); *H01L 25/0657* (2013.01); *H01L 25/50* (2013.01); *H01L 2224/2101* (2013.01); *H01L 2224/32145* (2013.01); *H01L 2224/33181* (2013.01); *H01L 2924/181* (2013.01)

(58) Field of Classification Search
   USPC ........ 257/774; 438/629, 637, 639, 640, 667, 438/668, 672, 675, 700, 701, 713, 978
   See application file for complete search history.

(56) References Cited

U.S. PATENT DOCUMENTS

| | | |
|---|---|---|
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2014/0252646 A1 | 9/2014 | Hung et al. |
| 2018/0315733 A1 | 11/2018 | Lin et al. |
| 2019/0148276 A1* | 5/2019 | Chen ...................... H01L 21/486 257/774 |
| 2019/0148301 A1 | 5/2019 | Huang et al. |
| 2020/0176346 A1* | 6/2020 | Wu ...................... H01L 23/3135 |
| 2020/0176378 A1* | 6/2020 | Wu ...................... H01L 23/5226 |
| 2020/0176405 A1* | 6/2020 | Wu ...................... H01L 23/3107 |
| 2021/0225780 A1* | 7/2021 | Wu ........................ H01L 21/486 |

* cited by examiner

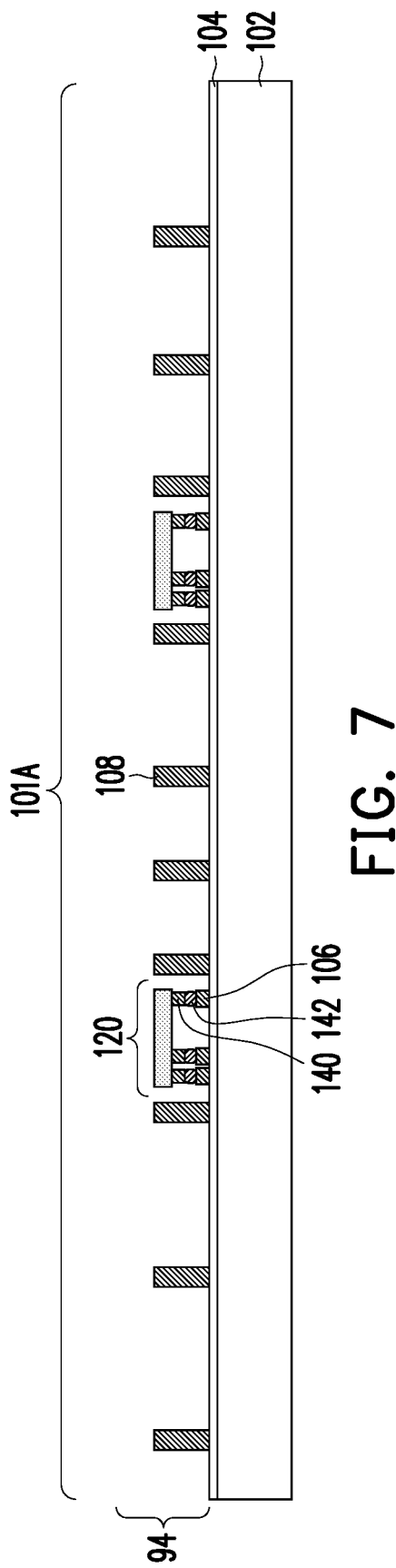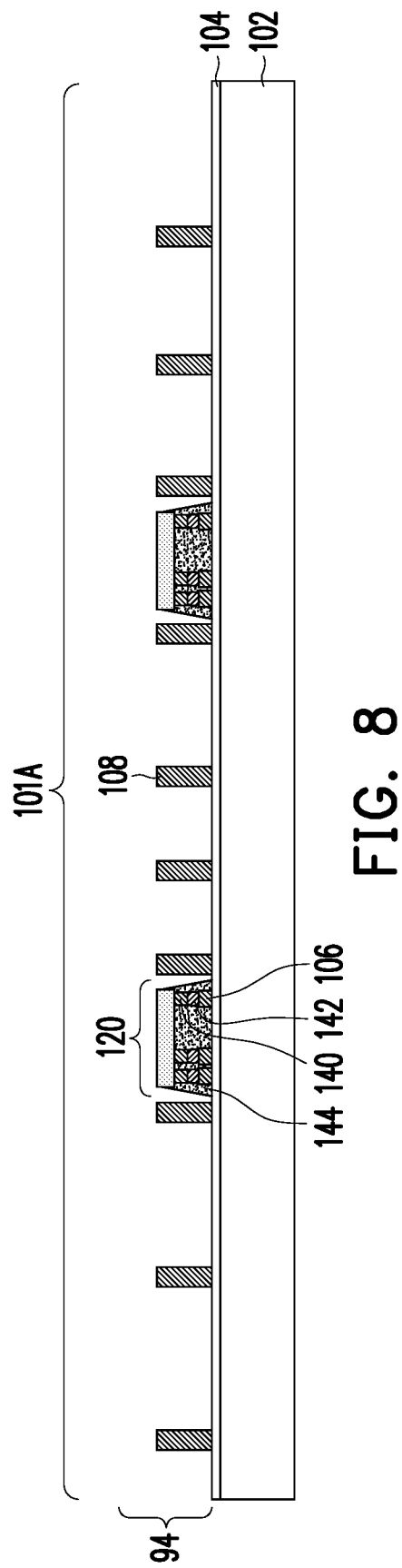

SEMICONDUCTOR PACKAGE AND METHOD COMPRISING FORMATION OF REDISTRIBUTION STRUCTURE AND INTERCONNECTING DIE

PRIORITY CLAIM AND CROSS-REFERENCE

This application is a divisional of U.S. patent application Ser. No. 17/412,625, entitled "Semiconductor Package and Method Comprising Formation of Redistribution Structure and Interconnecting Die," filed on Aug. 26, 2021, which application is incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4 through 24 and 27 through 30 illustrate cross-sectional views of intermediate steps during a process for forming a package component in accordance with some embodiments.

DETAILED DESCRIPTION

Figure 1:
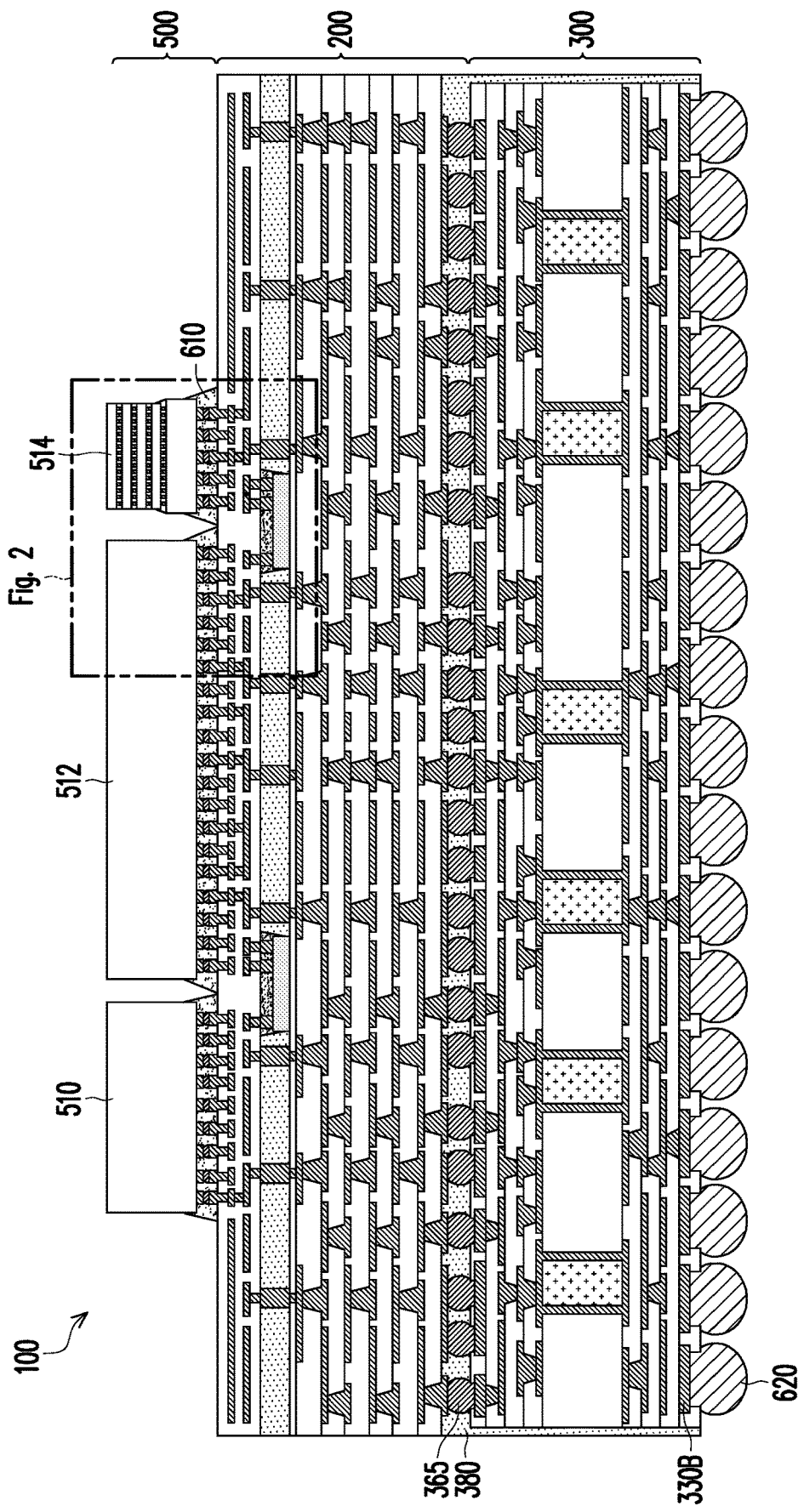
FIG. 1 illustrates a cross-sectional view of a package component in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a package component is having one or more integrated circuit dies. In some embodiments, the package component is a system-on-integrated-substrate (SoIS) package. The package component includes a local interconnect component embedded in a redistribution structure. The embedded local interconnect component provides electrical connection between the integrated circuit dies. The embedded local interconnect component increases the communication bandwidth between the integrated circuit dies while maintaining low contact resistance and high reliability. The low contact resistance and high reliability is at least in part due to a solder-free connection between the embedded local interconnect component and the redistribution structure. For example, by not having a solder connection in the final structure, the electromigration issue of solder joints are eliminated. In some embodiments, other components such as an integrated voltage regulator, an integrated passive device, a static random-access-memory, the like, or a combination thereof can also be embedded in a similar manner as the embedded local interconnect component.

The redistribution structure is connected to the integrated circuit dies and provides electrical connection between the integrated circuit dies and a core substrate and/or between the integrated circuit dies. The core substrate is additionally connected to a set of external conductive features. In such a manner, the integrated circuit dies are electrically connected to the core substrate, and ultimately to the external conductive features, through the core substrate and the redistribution structure.

In accordance with some embodiments, the redistribution structure, the embedded local interconnect component, the core substrate, and the integrated circuit dies, may be individually fabricated and tested prior to assembling the completed package component. This further increases component and board level reliability.

Due to the increased communication bandwidth between the integrated circuit dies provided by the local interconnect components, an interposer is not required between the integrated circuit dies and the redistribution structure. By removing the need for an interposer, the warpage mismatch between the integrated circuit package (including the integrated circuit dies) and the core substrate package (including the core substrate and the redistribution structure) is reduced because the coefficient of thermal expansion (CTE) mismatch between these two package structures is reduced.

In accordance with some embodiments, conductive connectors used to connect the core substrate to the redistribution structures may take the form of, for example, a ball grid array (BGA). Integration of such conductive connectors may provide flexibility in placement for semiconductor devices, such as integrated passive device (IPD) chips, integrated voltage regulators (IVRs), active chips, among other electrical components, to implement system-on-a-chip type of package components, thus reducing fabrication complexity. Such embodiments may also provide a greater amount of flexibility for various other package configurations as well.

Figure 2:
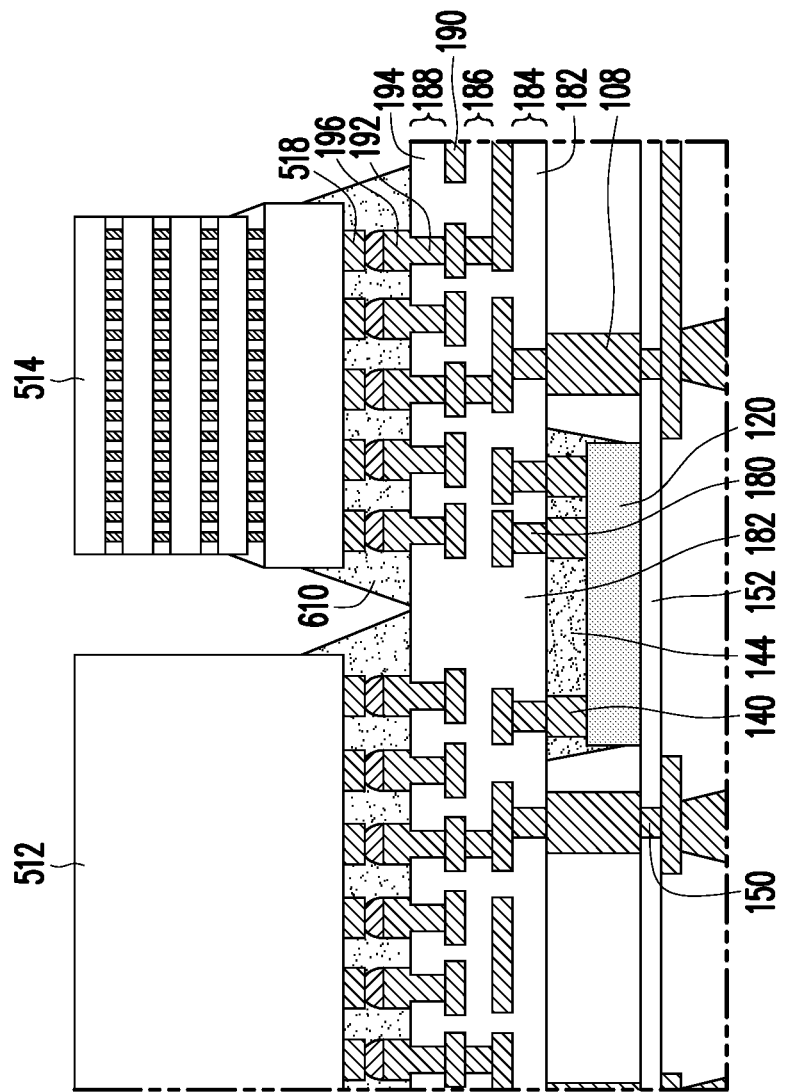
FIG. 2 illustrates a detailed view of a portion of the cross-sectional view of FIG. 1 in accordance with some embodiments.

FIG. 1 illustrates a cross-sectional view of a singulated package component 100 in accordance with some embodiments. FIG. 2 illustrates a detailed view of a portion of the cross-sectional view of FIG. 1 in accordance with some embodiments. The singulated package component 100 includes a semiconductor device (e.g., an integrated circuit package 500), a redistribution structure 200 having one or more redistribution layers, a core substrate 300, and external connectors 620, among other elements. The integrated circuit package 500 may include one or more dies, such as a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof. In some embodiments, the semiconductor device may be an integrated circuit die.

The integrated circuit package 500 may include a plurality of integrated circuit dies. As shown, the integrated circuit package 500 includes one or more logic dies 512, one or more memory dies 514, and one or more input/output (I/O) dies 516 (not shown in FIG. 1, but see FIG. 3). The integrated circuit dies may be formed in one or more wafers, which may include different device regions that are singulated in subsequent steps. The integrated circuit dies may be packaged with other similar or different integrated circuit dies using known manufacturing techniques. In some embodiments, the integrated circuit dies 512, 514, and 516 are formed using similar processes and techniques as described below in reference to FIG. 7.

In some embodiments, one or more of the integrated circuit dies 512, 514, and 516 may be stacked devices that include multiple semiconductor substrates. For example, the memory die 514 may be a memory device such as a hybrid memory cube (HMC) module, a high bandwidth memory (HBM) module, or the like that includes multiple memory dies. In such embodiments, the memory die 514 includes multiple semiconductor substrates interconnected by through-substrate vias (TSVs). Each of the semiconductor substrates may (or may not) have an interconnect structure.

The dies 512, 514, and 516 have bond pads 518 that are bonded to the conductive connectors 198. In some embodiments, the bond pads 518 are made of a conductive material and may be similar to the conductive lines (see, e.g., conductive lines 106) described below.

Conductive connectors 198 provide electrical connection between the redistribution structure 200 and the integrated circuit package 500. An underfill 610 may be included to securely bond the integrated circuit package 500 to the redistribution structure 200 and provide structural support and environmental protection.

As discussed in greater detail below, the redistribution structure 200 provides electrical pathing and connection between the integrated circuit package 500 and a core substrate 300 by way of conductive connectors 365. In some embodiments, the redistribution structure 200 has one or more redistribution layers comprising metallization patterns, comprising, for example, conductive lines 156 and 190 and conductive vias 158 and 192, and dielectric layers 160 and 194 separating adjacent layers of the conductive lines 156 and 190.

As discussed in greater detail below, the redistribution structure 200 includes one or more local interconnect components 120. The local interconnect components 120 provide electrical routing and connection between the integrated circuit dies 512, 514, and 516 of the integrated circuit package 500 and may be referred to as interconnecting dies 120. The local interconnect components 120 increase the communication bandwidth between the integrated circuit dies 512, 514, and 516 while maintaining low contact resistance and high reliability. The low contact resistance and high reliability is at least in part due to a solder-free connection between the embedded local interconnect component and the redistribution structure. As illustrated in FIGS. 1 and 2, the local interconnect components 120 are connected to metallization patterns 116 of the redistribution structure 200 by solder-free connections between bond pads 140 and conductive lines 106. In some embodiments, the local interconnect components 120 are embedded within the redistribution structure 200 and utilize a copper-to-copper connection after a temporary solder connection is removed.

The redistribution structure 200 may be electrically and mechanically attached to the core substrate 300. The core substrate 300 may include a central core 310, with conductive vias 320 extending through the central core 310, and additional optional redistribution structures 340 along opposing sides of the central core 310. Generally, the core substrate 300 provides structural support for the component package, as well as providing electrical signal routing between the integrated circuit package and the external connectors 80.

Encapsulant 380 may be included between the redistribution structure 200 and the core substrate 300 to securely bond the associated elements and provide structural support and environmental protection.

Figure 3:
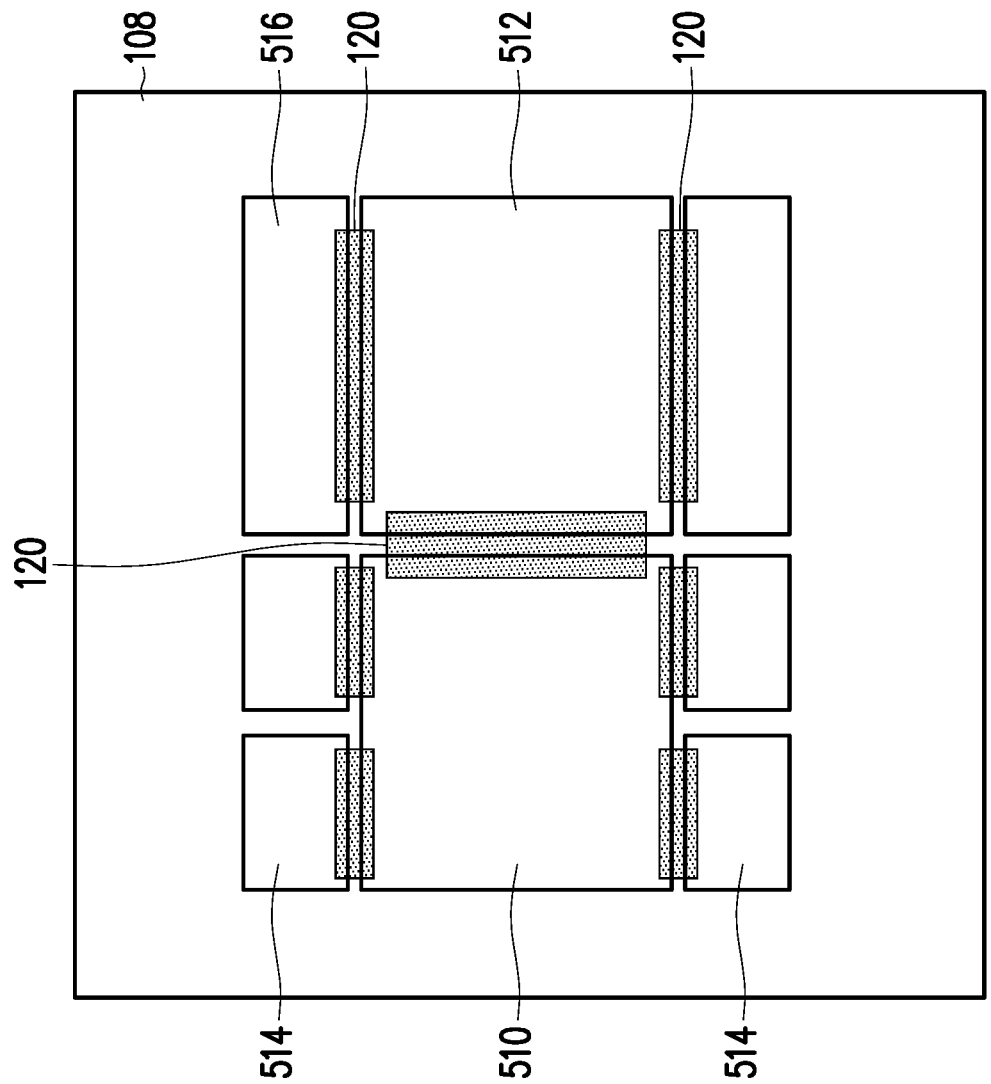
FIG. 3 illustrates a plan view of the package component in accordance with some embodiments.

FIG. 3 illustrates a plan view of the package component in accordance with some embodiments. The embodiment illustrated in FIG. 3 includes two logic dies 512, four memory dies 514, two I/O dies 516, and seven local interconnect components 120. In this embodiment, each of the memory dies 514 and I/O dies 516 are connected to at least one of the logic dies 512 by a respective local interconnect component 120. In addition, the two logic dies are connected together by a local interconnect component 120. Other embodiments may include more or less logic dies 512, memory dies 514, I/O dies 516, and local interconnect components 120. In some embodiments, each of the integrated circuit dies are connected to each adjacent integrated circuit die by a local interconnect component.

FIGS. 4 through 22 illustrate various intermediate stages in fabricating a redistribution structure 200 (see FIG. 22), in accordance with some embodiments. FIGS. 4,5, 7-22, and 27-29 illustrate a first package region 101A, but the steps illustrated in those Figures can be applied to multiple adjacent regions 101 simultaneously, as shown in FIGS. 24-26 and 30, for example. The first package region 101A (and a second package region 101B in FIGS. 24 and 30) are illustrated where each package region is eventually singulated from other package regions. The illustrations of the individual features have been simplified in FIGS. 4 through 30 for ease of illustration.

Figure 4:
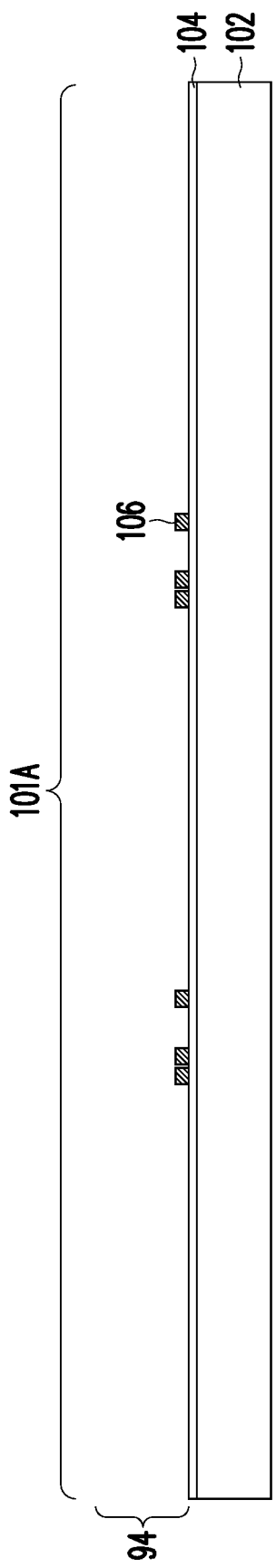

Referring first to FIG. 4, a carrier substrate 102 is provided, a release layer 104 is formed on the carrier substrate 102, and conductive lines 106 are formed over the release layer 104. The carrier substrate 102 may be a glass carrier substrate, a ceramic carrier substrate, or the like. The carrier substrate 102 may be a wafer, such that multiple redistribution structures can be formed on the carrier substrate 102 simultaneously.

The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and be planar within process variations.

In FIG. 4, conductive lines 106 are formed on the release layer 104. The conductive lines 106 are subsequently exposed by a carrier debonding process and removed along with subsequently formed solder connections 142 (see FIG. 7). Conductive lines 106 form the metallization pattern for redistribution layer 94. As an example to form the conductive lines 106, a seed layer (not shown) is formed over the release layer 104. In some embodiments, the seed layer is a metal layer, which may be a single layer or a composite layer comprising a plurality of sub-layers formed of different materials. The seed layer may be, for example, a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The patterning forms openings through the photoresist to expose the seed layer, where the openings in the photoresist correspond to the conductive lines 106. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the conductive lines 106. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

Figure 5:
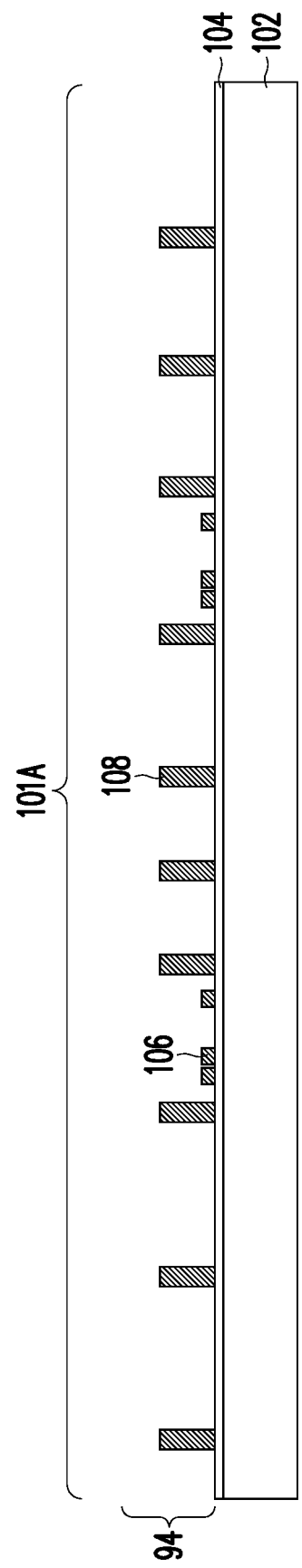

In FIG. 5, conductive vias 108 are formed over the carrier substrate 102. The conductive vias 108 are formed over the release layer 104. Conductive lines 106 and conductive vias 108, together, form the metallization pattern for redistribution layer 94. The conductive vias 108 may be similar to the conductive lines 106 described above and the description is not repeated herein. In some embodiments, the conductive vias 108 have a greater height than the conductive lines 106 as the conductive vias 108 act as a through dielectric vias adjacent the subsequently attached local interconnect components 120. In some embodiments, the conductive vias 108 have widths in a range from 5 µm to 100 µm.

Figure 6:
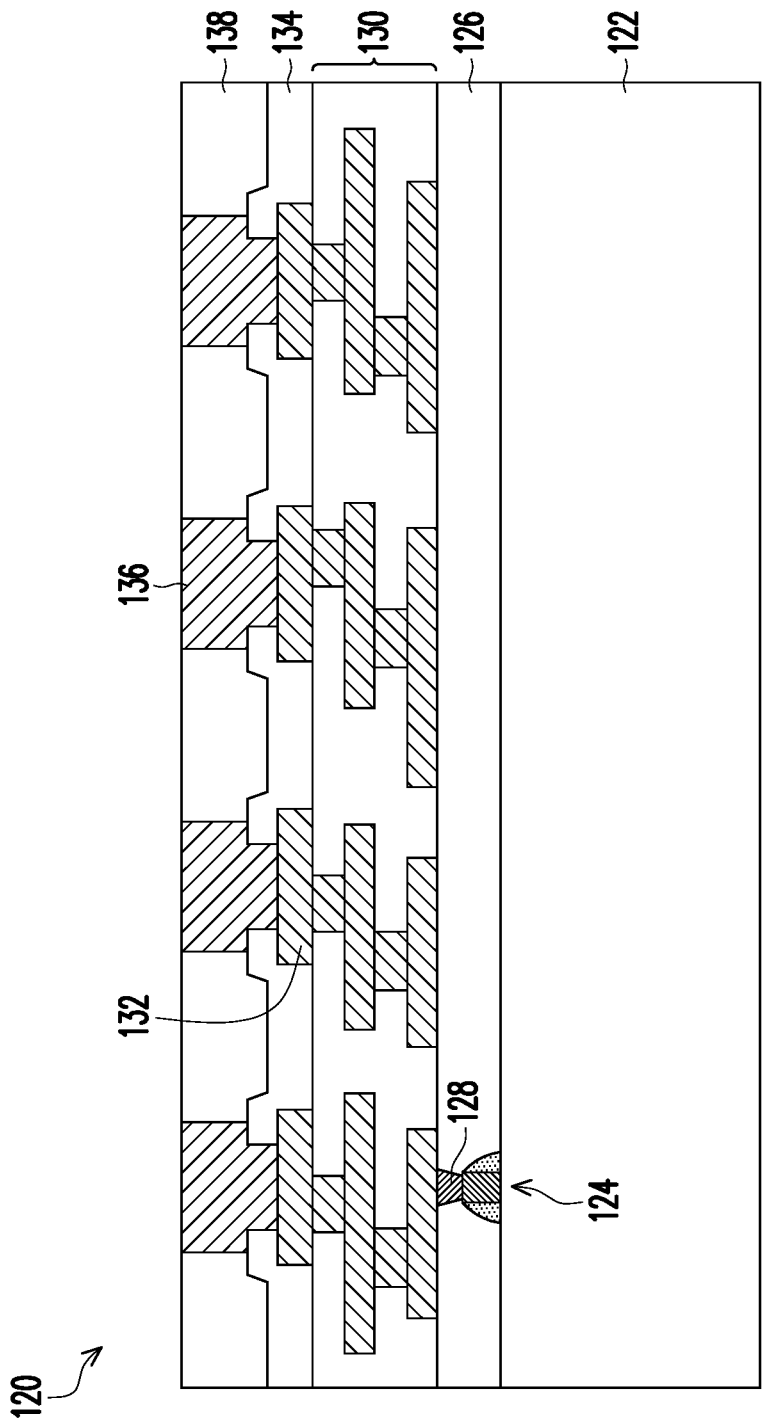

FIG. 6 illustrates a cross-sectional view of a local interconnect component 120 in accordance with some embodiments. The local interconnect component 120 will be embedded in subsequent processing in the redistribution structure 200.

The local interconnect component 120 may be formed in a wafer, which may include different device regions that are singulated in subsequent steps to form a plurality of local interconnect components. The local interconnect component 120 may be processed according to applicable manufacturing processes to form dies. For example, the local interconnect component 120 includes a substrate 122, such as silicon, doped or undoped, or an active layer of a semiconductor-on-insulator (SOI) substrate. The substrate 122 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some embodiments, the substrate 122 may be made up of a ceramic material, a polymer film, a magnetic material, the like or a combination thereof. Other substrates, such as multi-layered or gradient substrates, may also be used. The substrate 122 has an active surface (e.g., the surface facing upwards in FIG. 7), sometimes called a front side, and an inactive surface (e.g., the surface facing downwards in FIG. 7), sometimes called a back side.

In some embodiments, the local interconnect component 120 may include active or passive devices. In some embodiments, the local interconnect component 120 may be free of active or passive devices and may only be used for routing of electrical signals. In the embodiments that includes active or passive devices, devices (represented by a transistor) 124 may be formed at the front surface of the semiconductor substrate 122. The devices 124 may be active devices (e.g., transistors, diodes, etc.), capacitors, resistors, inductors, etc. An inter-layer dielectric (ILD) 126 is over the front surface of the semiconductor substrate 122. The ILD 126 surrounds and may cover the devices 124. The ILD 126 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

Conductive plugs 128 extend through the ILD 126 to electrically and physically couple the devices 124. For example, when the devices 124 are transistors, the conductive plugs 128 may couple the gates and source/drain regions of the transistors. The conductive plugs 128 may be formed of tungsten, cobalt, nickel, copper, silver, gold, aluminum, the like, or combinations thereof. An interconnect structure 130 is over the ILD 126 and conductive plugs 128. The interconnect structure 130 interconnects the devices 124 and/or provides electrical routing and connection between die connectors 136. The interconnect structure 130 may be formed by, for example, metallization patterns in dielectric layers on the ILD 126 using for example a damascene process. The metallization patterns include metal lines and vias formed in one or more low-k dielectric layers. In the embodiments, where devices 124 are included, the metallization patterns of the interconnect structure 130 are electrically coupled to the devices 124 by the conductive plugs 128. Although the interconnect structure 130 is illustrated with only two layers of conductive vias and two layers of conductive lines, in some embodiments, more or less layers of conductive vias and of conductive lines may be included as needed. For example, because the local interconnect component 120 is being used for electrical connection between the dies of the integrated circuit package 500, the interconnect structure 130 of the local interconnect component 120 will often have many more interconnect layers to accommodate this electrical connection.

The local interconnect component 120 further includes pads 132, such as aluminum pads, to which external connections are made. The pads 132 are on the active side of the local interconnect component 120, such as in and/or on the interconnect structure 130. One or more passivation films 134 are on the local interconnect component 120, such as on portions of the interconnect structure 130 and pads 132. Openings extend through the passivation films 134 to the pads 132. Die connectors 136, such as conductive pillars (for example, formed of a metal such as copper), extend through the openings in the passivation films 134 and are physically and electrically coupled to respective ones of the pads 132. The die connectors 136 may be formed by, for example, plating, or the like. The die connectors 136 electrically couple the respective integrated circuits of the local interconnect component 120.

Optionally, solder regions (e.g., solder balls or solder bumps) may be disposed on the pads 132. The solder balls may be used to perform chip probe (CP) testing on the local interconnect component 120. CP testing may be performed on the local interconnect component 120 to ascertain whether the local interconnect component 120 is a known good die (KGD). Thus, only local interconnect components 120, which are KGDs, undergo subsequent processing are packaged, and dies, which fail the CP testing, are not packaged. After testing, the solder regions may be removed in subsequent processing steps.

A dielectric layer 138 may (or may not) be on the active side of the local interconnect component 120, such as on the passivation films 134 and the die connectors 136. The dielectric layer 138 laterally encapsulates the die connectors 136, and the dielectric layer 138 is laterally coterminous with the local interconnect component 120. Initially, the dielectric layer 138 may bury the die connectors 136, such that the topmost surface of the dielectric layer 138 is above the topmost surfaces of the die connectors 136. In some embodiments where solder regions are disposed on the die connectors 136, the dielectric layer 138 may bury the solder regions as well. Alternatively, the solder regions may be removed prior to forming the dielectric layer 138.

The dielectric layer 138 may be a polymer such as PBO, polyimide, BCB, or the like; a nitride such as silicon nitride or the like; an oxide such as silicon oxide, PSG, BSG, BPSG, or the like; the like, or a combination thereof. The dielectric layer 138 may be formed, for example, by spin coating, lamination, chemical vapor deposition (CVD), or the like. In some embodiments, the die connectors 136 are exposed through the dielectric layer 138 during formation of the local interconnect component 120. Exposing the die connectors 136 may remove any solder regions that may be present on the die connectors 136. In some embodiments, the die connectors 136 have a pitch in a range from 20 μm to 80 μm.

In FIG. 7, the local interconnect components 120 are bonded to the conductive lines 106 of the redistribution structure 200. In some embodiments, the local interconnect components 120 have bond pads 140 bonded to the conductive lines 106 by solder regions 142. The bonds pads 140 are formed on the die connectors 136 and may be similar to the conductive lines 106 and the description is not repeated herein. In some embodiments, the bond pads 140 are omitted and the solder regions are formed directly on the die connectors 136. The solder regions 142 may include a conductive material such copper, aluminum, gold, nickel, silver, palladium, tin, the like, or a combination thereof. In some embodiments, the solder regions 142 are formed by initially forming a layer of solder (either on the conductive lines 106 or on the local interconnect component 120) through evaporation, electroplating, printing, solder transfer, ball placement, or the like. Once a layer of solder has been formed on the structure, a reflow may be performed in order to shape the material into the desired bump shapes.

The local interconnect components 120 may be attached to the conductive lines 106 through the solder regions 142. Attaching the local interconnect components 120 may include placing the local interconnect components 120 on the conductive lines 106 and reflowing the solder regions 142 to physically and electrically couple the local interconnect components 120 and the conductive lines 106.

In some embodiments, the conductive vias 108 are spaced apart from the local interconnect components 120 by a distance in a range from 5 μm to 2000 μm.

In FIG. 8, underfill 144 is formed between the local interconnect components 120 and the release layer 104 and extends up along sidewalls of the local interconnect components 120. The underfill 144 may reduce stress and protect the solder regions 142. The underfill 144 may be formed by a capillary flow process after the local interconnect components 120 are attached, or may be formed by a suitable deposition method.

Figure 9:
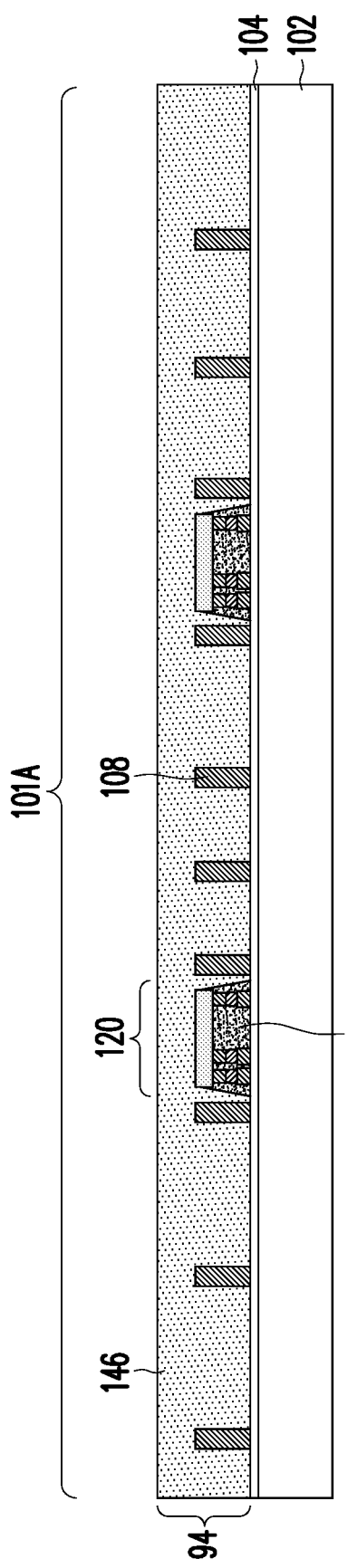

In FIG. 9, a dielectric layer 146 is formed on and around the conductive vias 108, the underfill 144, and the local interconnect components 120 in accordance with some embodiments. The dielectric layer 146 encapsulates the local interconnect components 120 and the conductive vias 108. The dielectric layer 146, the local interconnect components 120, and metallization pattern, including conductive vias 108 and conductive lines 106, form a redistribution layer 94.

It has been observed that by spacing apart the conductive vias 108 from the local interconnect component 120 by at least 5 μm, the formation of a dielectric layer 146 is improved. The distance being at least 5 μm allows for the dielectric layer 146 to be formed more uniformly (e.g., without voids, gaps, and/or seams) between the local interconnect component 120 and the conductive vias 108, which improves the dielectric properties of the dielectric layer 146. By improving the coverage and/or uniformity of the dielectric layer 146, the electrical performance of the package structure is improved.

In some embodiments, the dielectric layer 146 may be formed of pre-preg, Ajinomoto Build-up Film (ABF), resin coated copper (RCC), molding compound, polyimide, photo-imageable dielectric (PID), epoxy, or the like, and may be applied by compression molding, transfer molding, or the like. The encapsulant may be applied in liquid or semi-liquid form and then subsequently cured.

Figure 10:
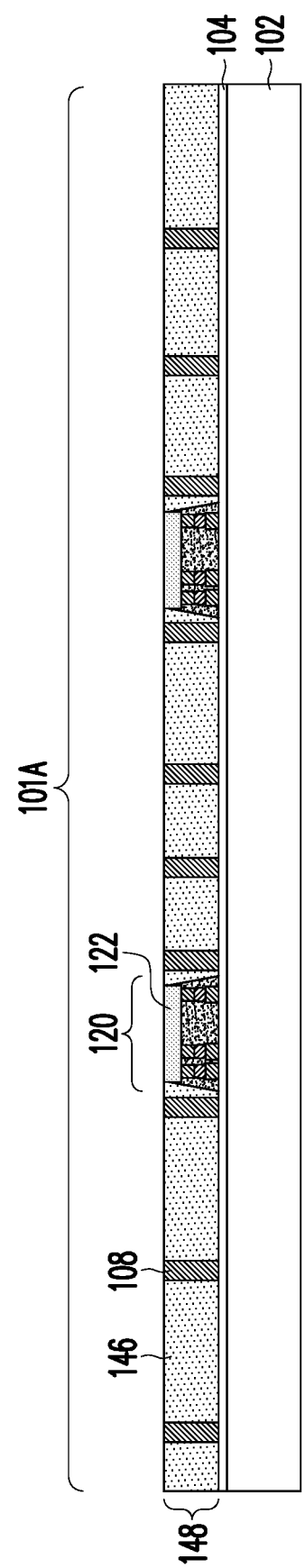

In some embodiments, the dielectric layer 146 is formed over the dielectric layer 114 such that the conductive lines 110, conductive vias 108, and local interconnect components are buried or covered, and FIG. 10 illustrates a planarization process that is performed on the dielectric layer 146 to expose the conductive vias 108 and the backsides of the substrates 122 of the local interconnect components 120. Topmost surfaces of the dielectric layer 146, conductive vias 108, and the substrates 122 of the local interconnect components 120 are level (e.g., planar) within process variations after the planarization process. The planarization process may be, for example, a chemical-mechanical polish (CMP). In some embodiments, the dielectric layer 146 may comprise other materials, such as silicon oxide, silicon nitride, or the like. After the planarization process (if any), the thickness of the local interconnect components is in a range from 10 μm to 100 μm and the thickness of the dielectric layer 146 is in a range from 5 μm to 100 μm. In some embodiments, the substrates 122 of the local interconnect components 120 have a thickness in a range from 2 μm to 30 μm. The area in a plan view of the substrates 122 of the local interconnect components 120 can be in a range from 2 mm×3 mm to 50 mm×80 mm.

The local interconnect components 120 provide electrical connection between the subsequently attached integrated circuit dies (e.g., 512, 514, and 516). The embedded local interconnect components 120 increases the communication bandwidth between the integrated circuit dies while maintaining low contact resistance and high reliability. In some embodiments, other components such as an integrated voltage regulator, an integrated passive device, a static random-access-memory, the like, or a combination thereof can also be embedded in a similar manner as the embedded local interconnect component.

Figure 11:
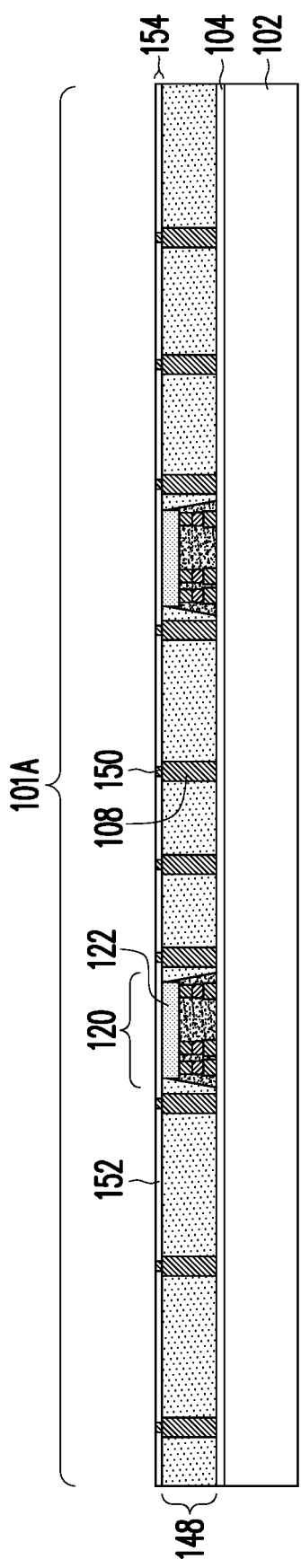

In FIG. 11, a dielectric layer 152 is formed on the dielectric layer 146, the local interconnect components 120, and the conductive vias 108. Further in FIG. 11, conductive vias 150 are formed in the dielectric layer 152. The conductive vias 150 are over and electrically coupled to the conductive vias 108. The dielectric layer 152 the conductive vias 150 form a redistribution layer 154.

The conductive vias 150 form the metallization pattern for redistribution layer 154. As an example to form the conductive vias 150, a seed layer (not shown) is formed over the dielectric layer 146, the local interconnect components 120, and the conductive vias 108. In some embodiments, the seed layer is a metal layer, which may be a single layer or a composite layer comprising a plurality of sub-layers formed of different materials. The seed layer may be, for example, a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The patterning forms openings through the photoresist to expose the seed layer, where the openings in the photoresist correspond to the conductive vias 150. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the conductive vias 150. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The dielectric layer 152 is formed on and around the conductive vias 150. After formation, the dielectric layer 152 surrounds the conductive vias 150. The dielectric layer 152 may provide electrical isolation and environmental protection. The dielectric layer 152 may be a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; the like; or a combination thereof. The dielectric layer 152 may be formed, for example, by spin coating, lamination, chemical vapor deposition (CVD), or the like. The dielectric layer 152 may have an upper surface that is level within process variations. In some embodiments, the dielectric layer is formed to have a thickness in a range from 2 μm to 50 μm. The dielectric layer 152 may be a different material than the dielectric layer 146.

Figure 12:
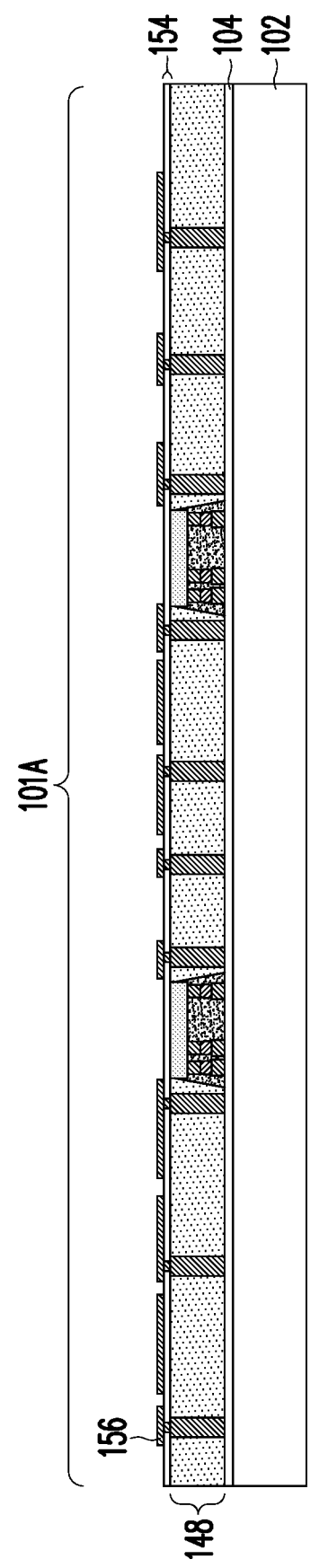

In FIG. 12, conductive lines 156 are formed on the conductive vias 150 and the dielectric layer 152. The conductive lines 156 may be similar to the conductive lines 106 described above and the description is not repeated herein.

Figure 13:
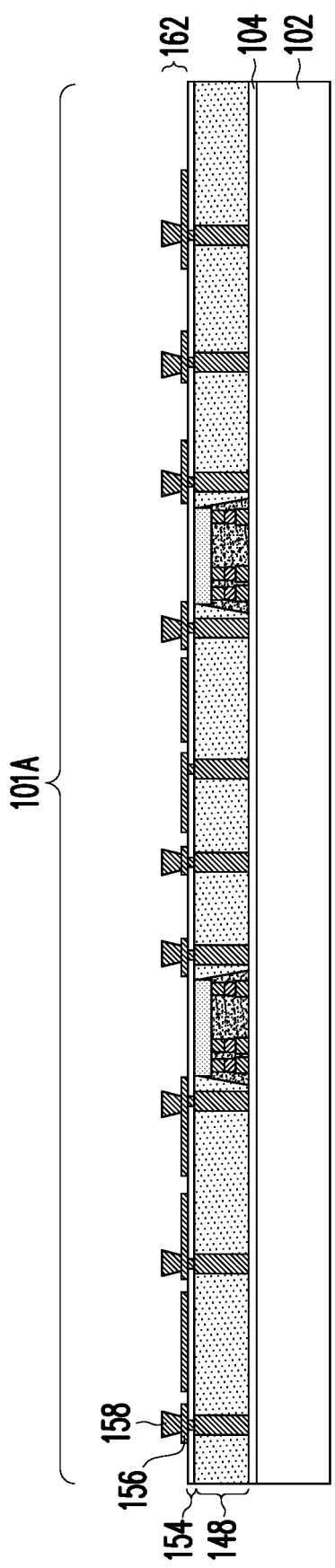

In FIG. 13, conductive vias 158 are formed on and extending from the conductive lines 156. The conductive vias 158 may be similar to the conductive vias 108 and/or 150 described above and the description is not repeated herein. Conductive lines 156 and conductive vias 158, together, form the metallization pattern for redistribution layer 162.

Figure 14:
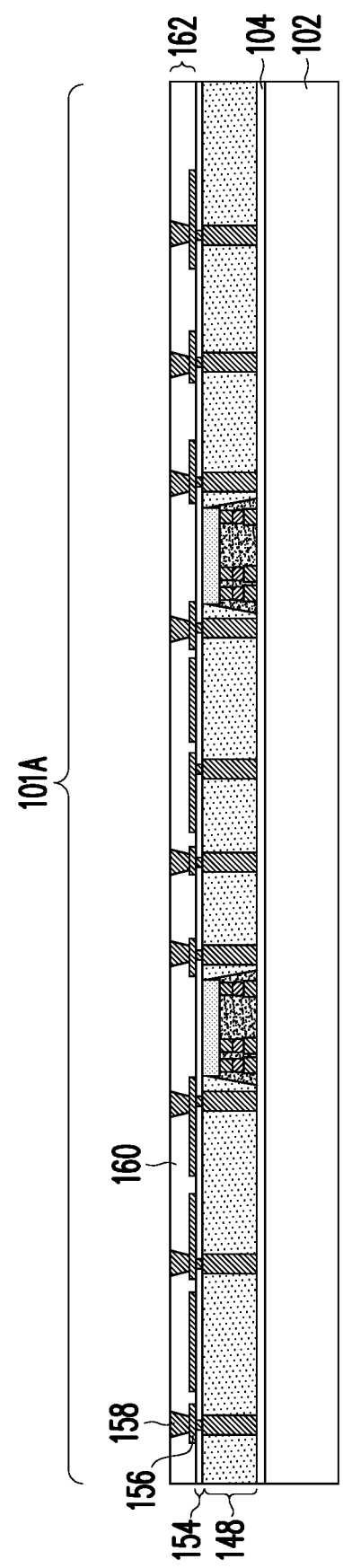

In FIG. 14, a dielectric layer 160 is formed on and around the conductive lines 156 and the conductive vias 158 in accordance with some embodiments. After formation, the dielectric layer 160 surrounds the conductive vias 158 and conductive lines 156. The dielectric layer 160 and metallization pattern, including conductive vias 158 and conductive lines 156, form a redistribution layer 162. The dielectric layer 160 may be similar to the dielectric layer 146 described above and the description is not repeated herein. In some embodiments, the dielectric layer 160 is formed over the dielectric layer 146 and the local interconnect components 120 such that the conductive lines 156 and conductive vias 158 are buried or covered, and a planarization process is then performed on the dielectric layer 160 to expose the conductive vias 158. Topmost surfaces of the dielectric layer 160 and conductive vias 158 are level (e.g., planar) within process variations after the planarization process. The planarization process may be, for example, a CMP.

Figure 15:
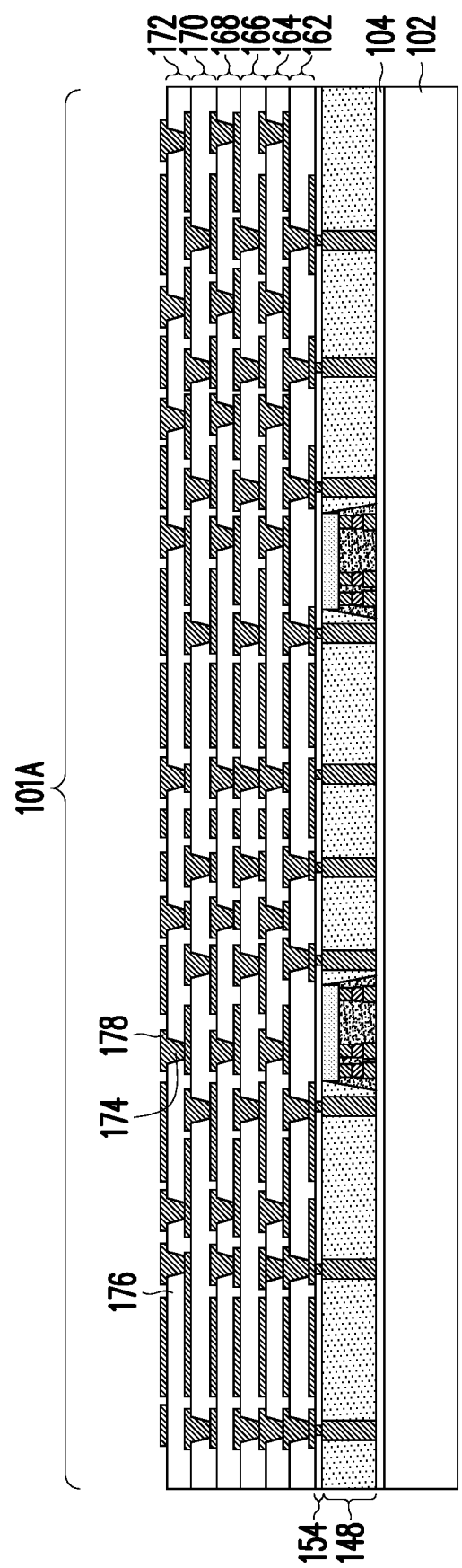

In FIG. 15, the steps and process discussed above to form redistribution layer 162 are repeated to form additionally shown redistribution layers 164, 168, 170, and 172. In some embodiments, the process described above to form the redistribution layer 162 may be repeated one or more times to provide additional routing layers as desired for a particular design. Eight redistribution layers 148, 154, 162, 164, 166, 168, 170, and 172 are shown for illustrative purposes. In some embodiments more or less than eight may be used. The metallization patterns for each redistribution layer 148, 154, 162, 164, 166, 168, 170, and 172 may have separately formed conductive lines and conductive vias (as shown), or may each be a single pattern having line and via portions.

In some embodiments, an additional set of conductive lines 178 are formed over each conductive via 174 and portion of the dielectric layer 176 of the uppermost redistribution layer, e.g., the redistribution layer 172 in the illustrated embodiment. This additional set of conductive lines 178 provides a larger dimensional footprint for connecting a core substrate as discussed below.

Where encapsulant and a subsequent CMP process is used to planarize redistribution layers 148, 162, 164, 166, 168, 170, and 172, the dimensions, and roughness of the associated layers can be well controlled and more easily built up to larger thicknesses. In some embodiments, the thickness of redistribution layers 148, 162, 164, 166, 168, 170, and 172 is each between 5 μm and 100 μm. More or fewer redistribution layers may be formed by, respectively, repeating or omitting the steps and process discussed above.

Although FIGS. 4 through 15 illustrate a formation process that forms conductive lines and vias before the dielectric layer that surrounds the conductive lines and vias, other formation processes are within the scope of this disclosure. For example, in other embodiments, a dielectric layer is first formed and then the metallization pattern (which includes both lines and vias) are formed. The metallization pattern includes conductive elements extending along the major surface of the dielectric layer and extending through the dielectric layer to physically and electrically couple to an underlying conductive layer. As an example to form the metallization pattern, openings are formed through the dielectric layer in the locations where vias are desired and a seed layer is formed over the dielectric layer and in the openings extending through the dielectric layer. A photoresist is then formed and patterned on the seed layer. The patterning forms openings through the photoresist to expose the seed layer, with the pattern of the openings corresponding to the metallization pattern. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern. The photoresist and portions of the seed layer on which the conductive material is not formed are removed. Once the photoresist is removed, exposed portions of the seed layer are removed, such as by using an acceptable etching process, such as by wet or dry etching. The combination of the dielectric layer and the metallization pattern form the redistribution layer.

Figure 16:
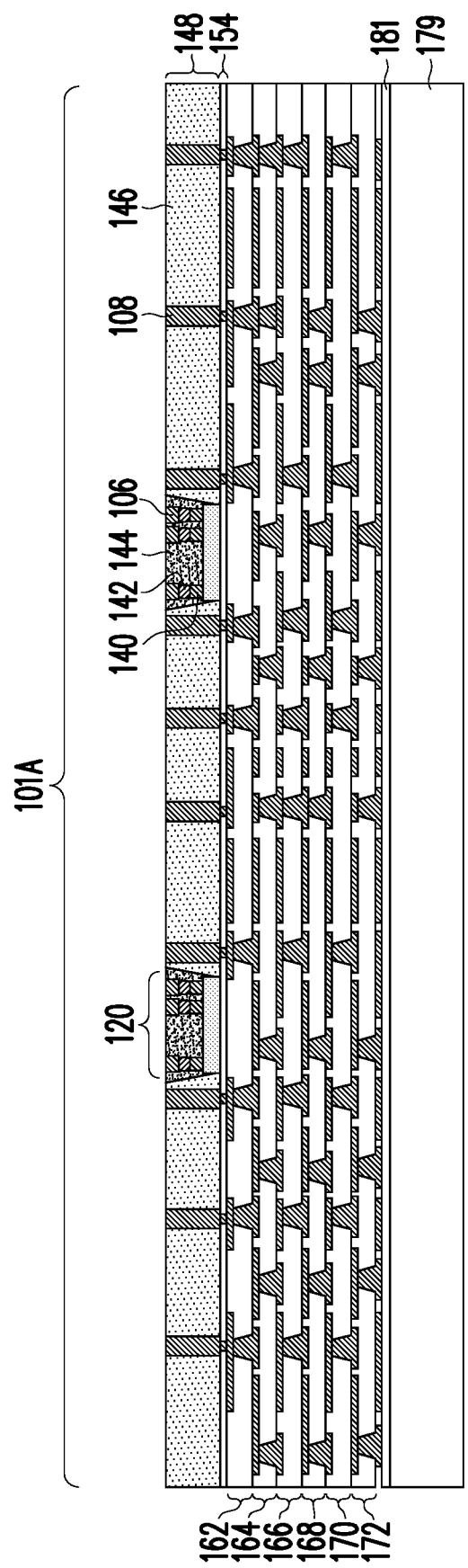

In FIG. 16, a carrier substrate de-bonding is performed to detach (or "de-bond") the carrier substrate 102 from the dielectric layer 146, conductive lines 106, and conductive vias 108. In accordance with some embodiments, the de-bonding includes projecting a light such as a laser light or an UV light on the release layer 104 so that the release layer 104 decomposes under the heat of the light and the carrier substrate 102 can be removed. The structure is then flipped over and placed on another carrier substrate 179 and release layer 181.

Figure 17:
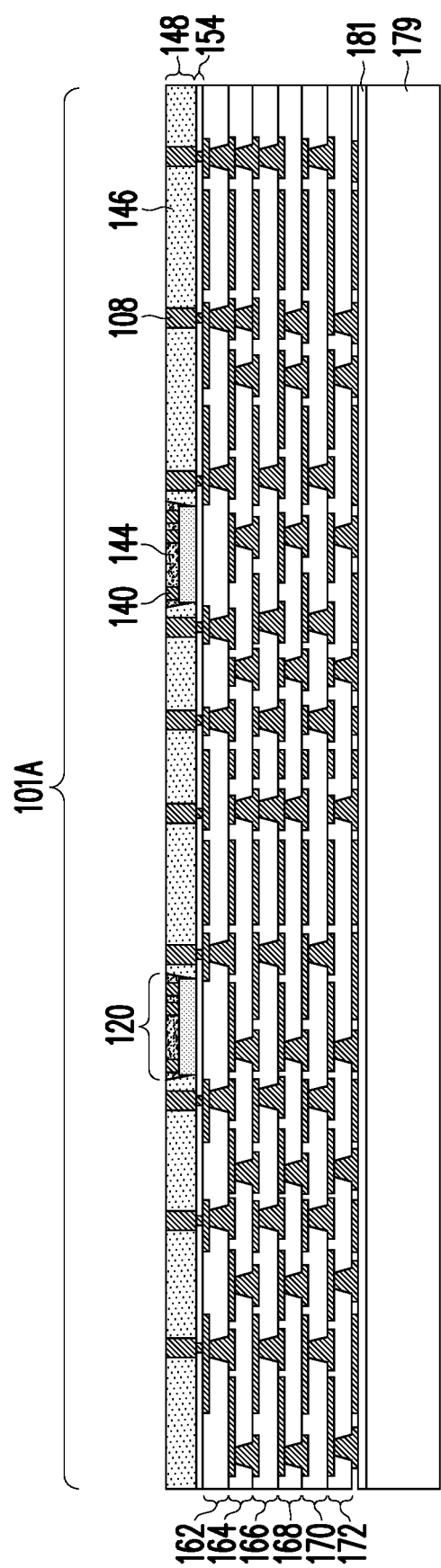

In FIG. 17, the dielectric layer 146 and the conductive vias 108 are thinned and the conductive lines 106 and the solder regions 142 are removed and the bond pads 140 and the underfill 144 of the local interconnect components 120 are exposed. In some embodiments, these components are thinned and removed by a planarization process, an etch process, or a combination thereof. Topmost surfaces of the dielectric layer 146, the underfill 144, the conductive vias 108, and the bond pads 140 are level (e.g., planar) after the planarization process within process variations. The planarization process may be, for example, a chemical-mechanical polish (CMP), a grinding process, or the like. The etch process may be, for example, a dry etch process, a reactive ion etch (RIE) process, or the like. In some embodiments, there are remnants of the solder regions 142 on the bond pads 140 after the removal process, and, in other embodiments, the solder regions 142 are completely removed and there are no remnants of the solder regions 142 on the bond pads 140 after the removal process. In the embodiments where the bond pads 140 are omitted and the solder regions 142 were formed directly on the die connectors 136, the die connectors 136 of the local interconnect components 120 are exposed by the thinning and removal process.

After the removal of the conductive lines 106 and solder regions 142, the bond pads 140 have a height in a range from 2 μm to 30 μm and a pitch in a range from 20 μm to 80 μm.

Figure 18:
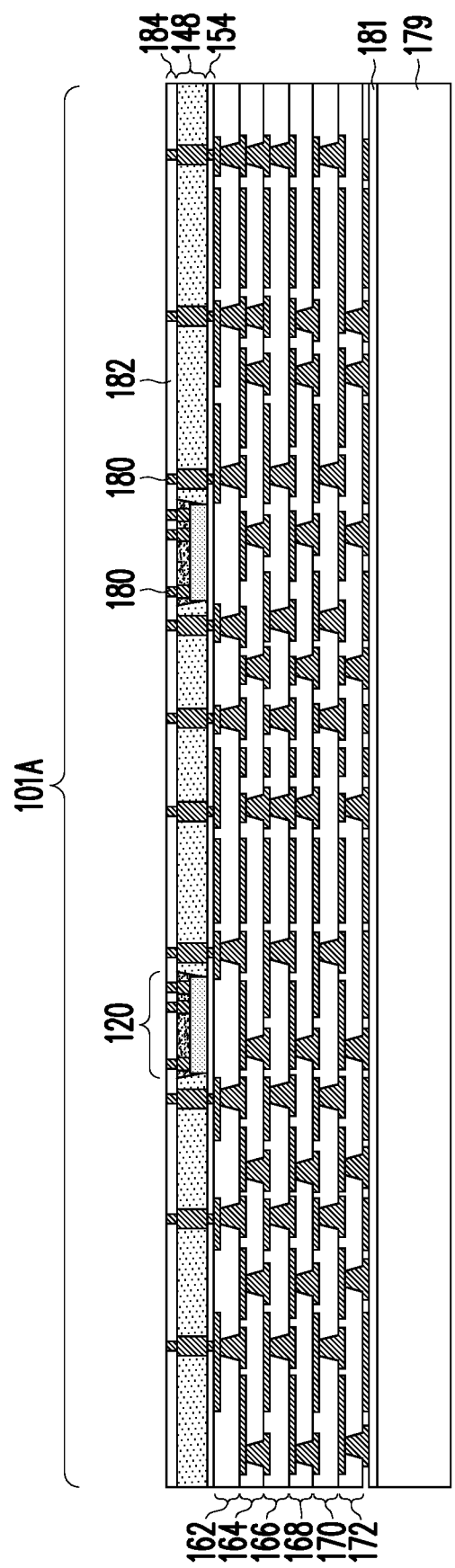

In FIG. 18, a dielectric layer 182 is formed on the dielectric layer 146, the bond pads 140, the underfill 144, and the conductive vias 108. Further in FIG. 18, conductive vias 180 are formed in the dielectric layer 182. The conductive vias 180 are over and electrically coupled to the conductive vias 108 and the bonds pads 140. The dielectric layer 182 the conductive vias 180 form a redistribution layer 184. The dielectric layer 182 and the conductive vias 180 are similar to the dielectric layer 152 and the conductive vias 150 described above and the description is not repeated herein.

Due to the removal of the solder regions 142 and the conductive lines 106, the bond pads 140 of the local interconnect components 120 are physically and electrically contacting the conductive vias 180. In some embodiments, the bond pads 140 of the local interconnect components 120 and the conductive vias 180 both comprise copper and form a copper-to-copper connection between the local interconnect components 120 and the other parts of the redistribution structure 200.

By removing the solder regions 142 from the bond pads 140 of the local interconnect component 120, the contact resistance is lower, and the reliability is higher. For example, by not having a solder connection in the final structure, the electromigration issue of solder joints are eliminated from the connection of the local interconnect components 120.

Figure 19:
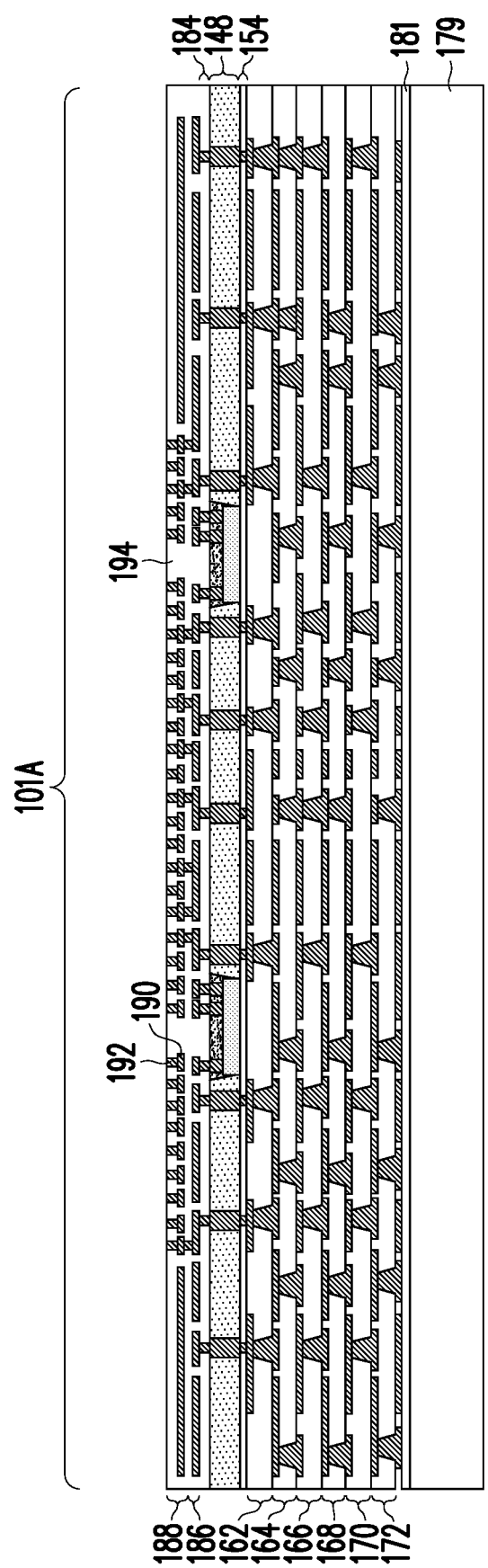

In FIG. 19, the steps and process discussed above to form redistribution layers 170 and 172 are repeated to form redistribution layers 186 and 188 over the dielectric layer 152 and the conductive vias 150. The redistribution layer 188 includes a dielectric layer 194, conductive lines 190, and vias 192 over the conductive lines 190. The dielectric layers of redistribution layers 184, 186, and 188 may each be formed to have a thickness in a range from 2 μm to 50 μm.

The dielectric layer 146 (and the dielectric layers of redistribution layers 162, 164, 166, 168, 170, and 172) may be a different material than the dielectric layers of redistribution layers 154, 184, 186, and 188.

Figure 20:
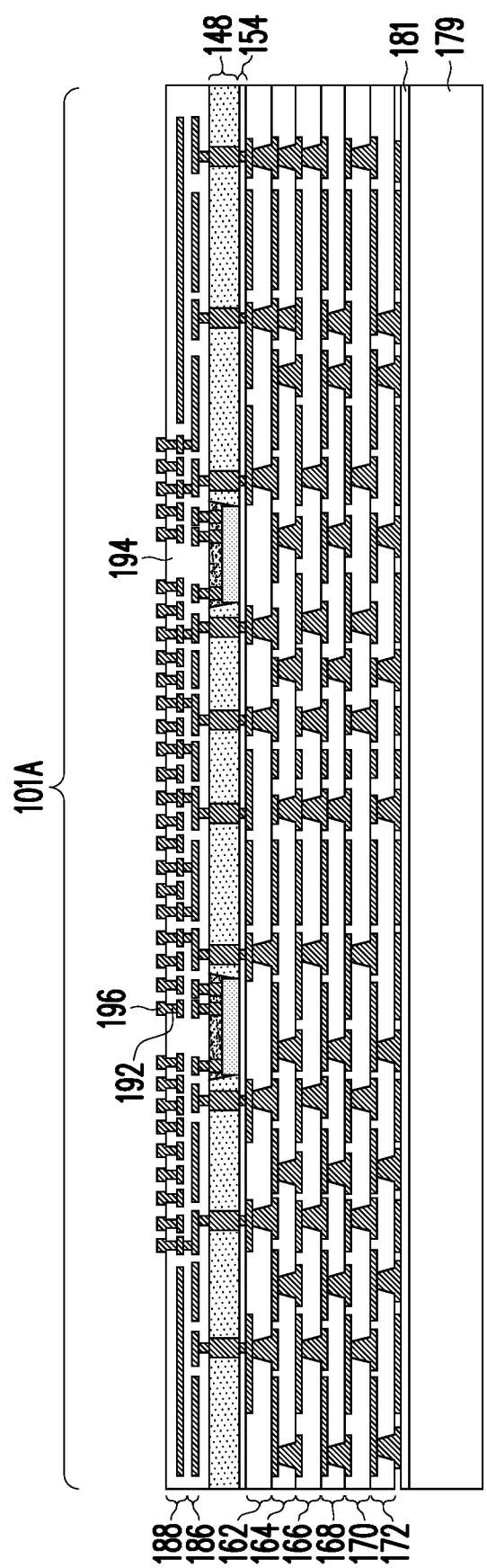

In FIG. 20, under-bump metallizations (UBMs) 196 (sometimes referred to as pads 196) are formed for external connection to conductive vias 192. The UBMs 196 have bump portions on and extending along the major surface of the dielectric layer 194, and may have via portions extending into the dielectric layer 194 to physically and electrically couple the conductive via 192. As a result, the UBMs 196 are electrically coupled to the through conductive lines 190 and the local interconnect components 120. The UBMs 196 may be formed of the same material as the conductive lines 190. In some embodiments, the pitch of the UBMs 196 are in a range from 20 μm to 80 μm.

Figure 21:
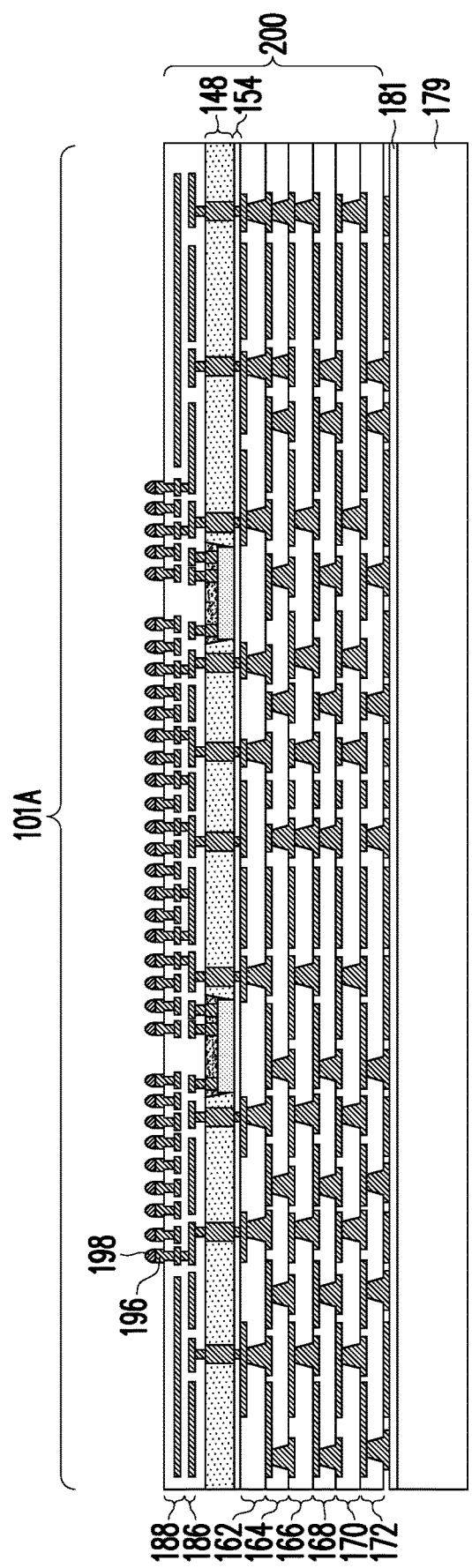

In FIG. 21, conductive connectors 198 are formed on the UBMs 196 forming the redistribution structure 200. The conductive connectors 198 allow for physical and electrical connection to dies or another package structure. The conductive connectors 198 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 198 may include a conductive material such as solder, copper, aluminum, gold, nickel, silver, palladium, tin, the like, or a combination thereof. In some embodiments, the conductive connectors 198 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 198 comprise metal pillars (such as a copper pillar) formed by a sputtering, printing, electro plating, electroless plating, CVD, or the like. The metal pillars may be solder free and have vertical (within process variations) sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 22:
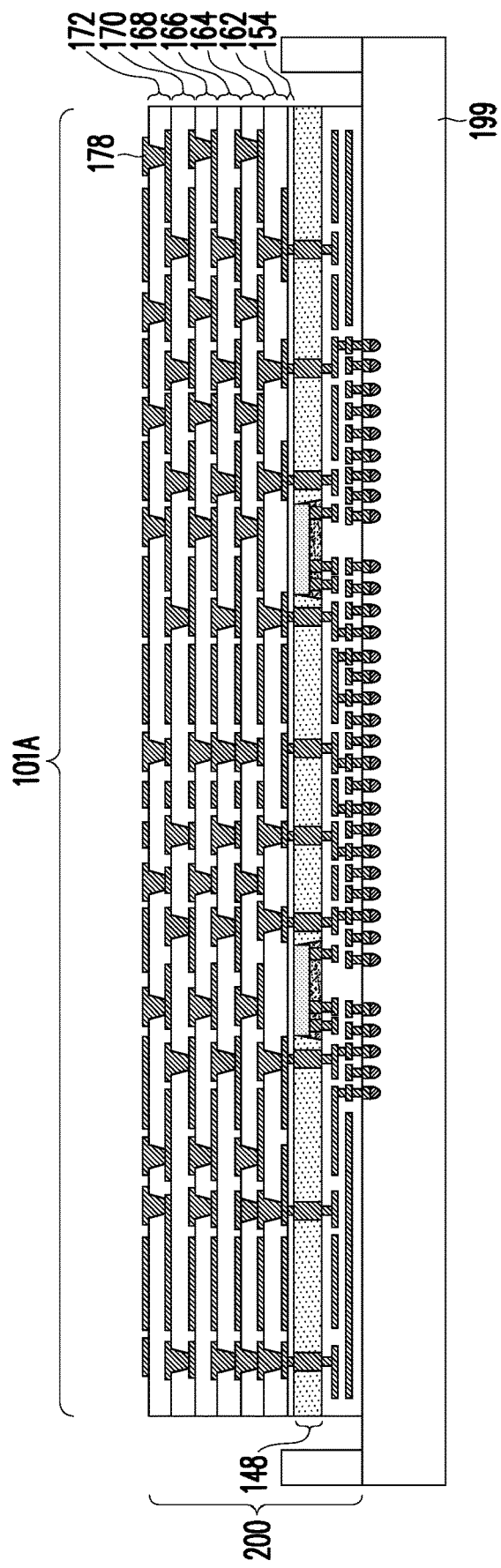

In FIG. 22, a carrier substrate de-bonding is performed to detach (or "de-bond") the carrier substrate 179 from the conductive lines 178 and/or the dielectric layer 176. In accordance with some embodiments, the de-bonding includes projecting a light such as a laser light or an UV light on the release layer 181 so that the release layer 181 decomposes under the heat of the light and the carrier substrate 179 can be removed. The structure is then flipped over and placed on a frame 199.

Figure 23:
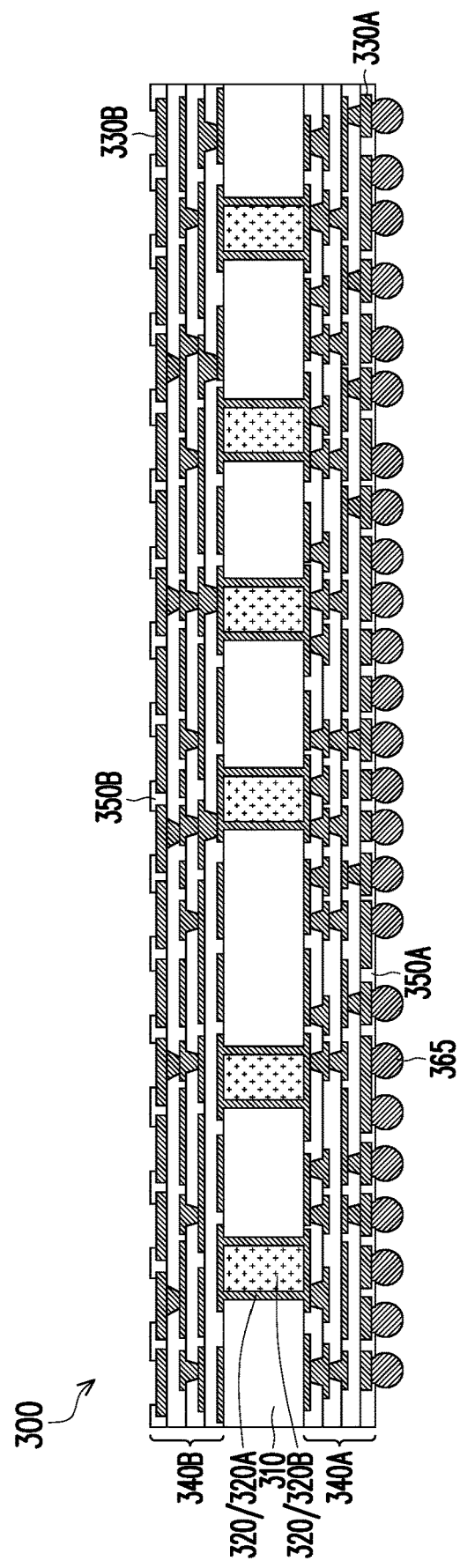
Figure 24:
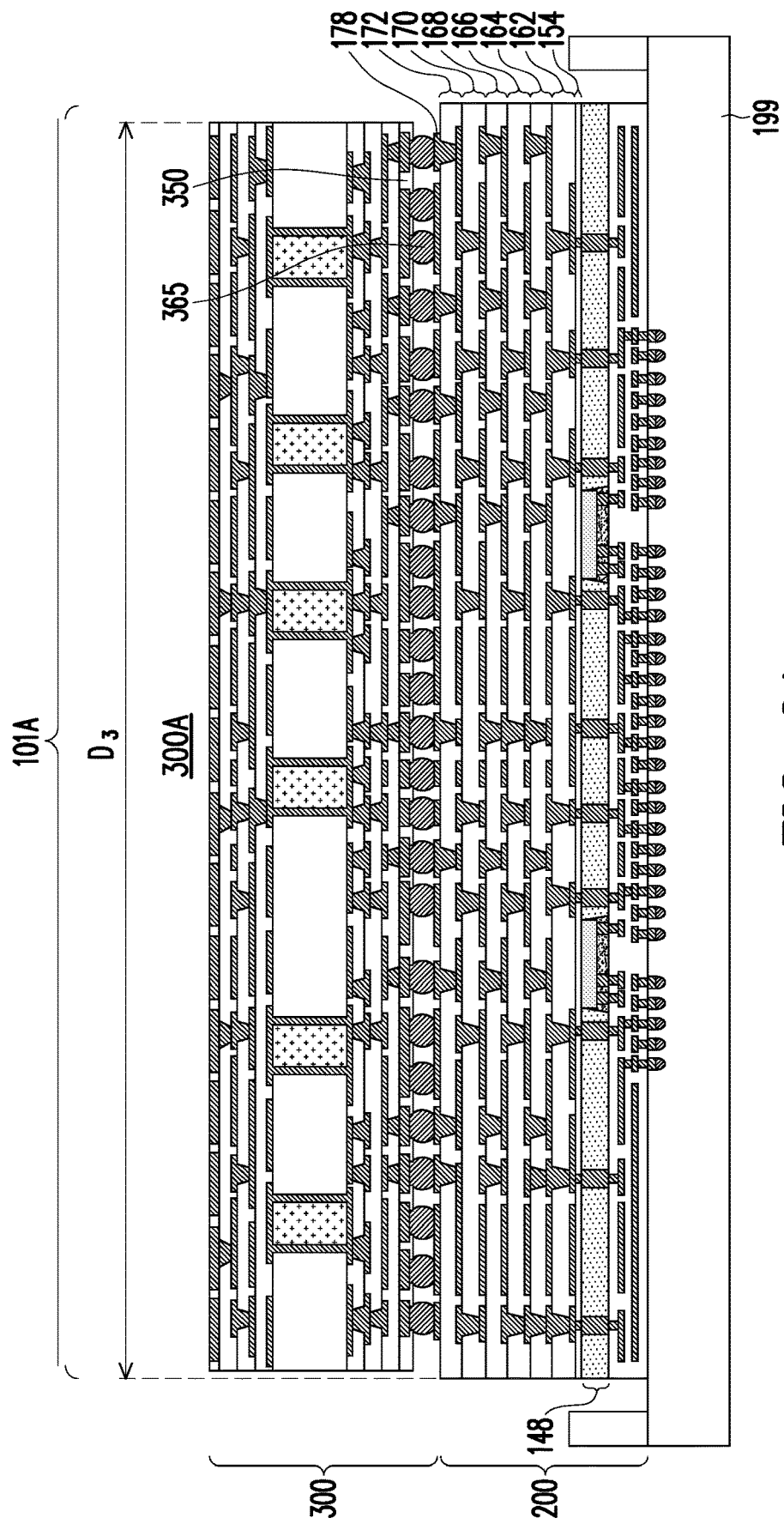

In FIG. 23, a core substrate 300 is illustrated and, in FIG. 24, is bonded to the redistribution structure 200. Utilizing the core substrate 300 has the advantage of having the core substrate 300 being manufactured in a separate process. In addition, because core substrate 300 is formed in a separate process, it can be tested separately so that a known good core substrate 300 is used. For example, in some embodiments, the core substrate 300 may be individually or batch tested, validated, and/or verified prior to bonding the core substrate 300 to the redistribution structure 200.

The core substrate 300 may be, e.g., an organic substrate, a ceramic substrate, a silicon substrate, or the like. Conductive connectors 365 are used to attach the core substrate 300 to the redistribution structure 200. Attaching the core substrate 300 may include placing the core substrate 300 on the redistribution structure 200 and reflowing the conductive connectors 365 to physically and electrically couple the core substrate 300 and the redistribution structure 200.

Before being attached to the redistribution structure 200, the core substrate 300 may be processed according to applicable manufacturing processes to form redistribution structures in the core substrate 300. For example, the core substrate 300 includes a core 310. The core 310 may be formed of one or more layers of glass fiber, resin, filler, pre-preg, epoxy, silica filler, Ajinomoto Build-up Film (ABF), polyimide, molding compound, other materials, and/or combinations thereof. In some embodiments, for example, two layers are of material make up the core 310. The core 310 may be formed of organic and/or inorganic materials. In some embodiments, the core 310 includes one or more passive components (not shown) embedded inside. The core 310 may comprise other materials or components. Conductive vias 320 are formed extending through the core 310. The conductive vias 320 comprise a conductive material 320A such as copper, a copper alloy, or other conductors, and may include a barrier layer (not shown), liner (not shown), seed layer (not shown), and/or a fill material 320B, in some embodiments. The conductive vias 320 provide vertical electrical connections from one side of the core 310 to the other side of the core 310. For example, some of the conductive vias 320 are coupled between conductive features at one side of the core 310 and conductive features at an opposite side of the core 310. Holes for the conductive vias 320 may be formed using a drilling process, photolithography, a laser process, or other methods, as examples, and the holes of the conductive vias 320 are then filled or plated with conductive material. In some embodiments, the conductive vias 320 are hollow conductive through vias having centers that are filled with an insulating material. Redistribution structures 340A and 340B are formed on opposing sides of the core 310. The redistribution structures 340A and 340B are electrically coupled by the conductive vias 320, and fan-in/fan-out electrical signals.

The redistribution structures 340A and 340B each include dielectric layers, formed of ABF, pre-preg, or the like, and metallization patterns. Each respective metallization pattern has line portions on and extending along a major surface of a respective dielectric layer, and has via portions extending through the respective dielectric layer. The redistribution structures 340A and 340B each, respectively, include under-bump metallurgies (UBMs) 330A and 330B for external connection, and solder resists 350A and 350B protecting the features of the redistribution structures 340A and 340B. The redistribution structure 340A is attached to the redistribution structure 200 by the UBMs 330A through the conductive connectors 365 as illustrated in FIG. 23. More or fewer dielectric layers and metallization patterns may be formed in the redistribution structures 340A and 340B than shown in FIG. 23.

The core substrate 300 may include active and passive devices (not shown), or may be free from either active devices, passive devices, or both. A wide variety of devices such as transistors, capacitors, resistors, inductors, combinations of these, and the like may be used. The devices may be formed using any suitable methods.

Conductive connectors 365 may be used to bond the core substrates 300A and 300B to the redistribution structure 200 as illustrated in FIG. 24. The conductive connectors 365 may be first formed on either the core substrates 300A and 300B, or the redistribution structure 200, and then reflowed to complete the bond. For example, in the embodiment shown in FIG. 24, conductive connectors 365 are formed on UBMs 330A of the bottom redistribution structure 340A with a pitch between 150 μm and 1000 μm. The conductive connectors 365 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 365 may include a conductive material such as solder, copper, aluminum, gold, nickel, silver, palladium, tin, the like, or a combination thereof. In some embodiments, the conductive connectors 365 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 365 comprise metal pillars (such as a copper pillar) formed by a sputtering, printing, electro plating, electroless plating, CVD, or the like. The metal pillars may be solder free and have vertical sidewalls within process variations. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

FIGS. 24 through 30 illustrate various intermediate stages in fabricating a package component 100 (see FIG. 1), in accordance with some embodiments. In FIG. 24, core substrates 300A and 300B are bonded to the redistribution structure 200 (see, e.g., FIG. 22) in first package region 101A and second package region 101B, respectively. In some embodiments, the core substrate 300A is separated from the adjacent core substrate 300B by a distance D1 between about 25 µm and about 1,000 µm. This distance provides space between a first package region 101A and a second package region 101B for singulation of the redistribution structure 200 into separate packages in a subsequent process. In embodiments such as that illustrated in FIG. 24, dimensions D3 of the core substrates 300A and 300B is less than the dimensions of the first package region 101A and second package region 101B D2, respectively to allow for encapsulation and singulation without damaging the core substrates 300A and 300B. In some embodiments, a standoff height of 20 µm to 500 µm is utilized between the core substrates 300A and 300B and the redistribution structure 200.

In some embodiments, the core substrates 300A and 300B may be placed on the redistribution structure 200 using a pick and place process or another suitable process and the conductive connectors 365 bonded by flip chip bonding process or other suitable bonding process. In some embodiments, the conductive connectors 365 are reflowed to attach the core substrates 300A and 300B to the redistribution structure 200 by way of metallization pattern 174. The conductive connectors 365 electrically and/or physically couple the core substrates 300A and 300B to the redistribution structure 200.

The conductive connectors 365 may have an epoxy flux (not shown) formed thereon before they are reflowed with at least some of the epoxy portion of the epoxy flux remaining after the core substrates 300A and 300B are attached to the redistribution structure 200.

Figure 25:
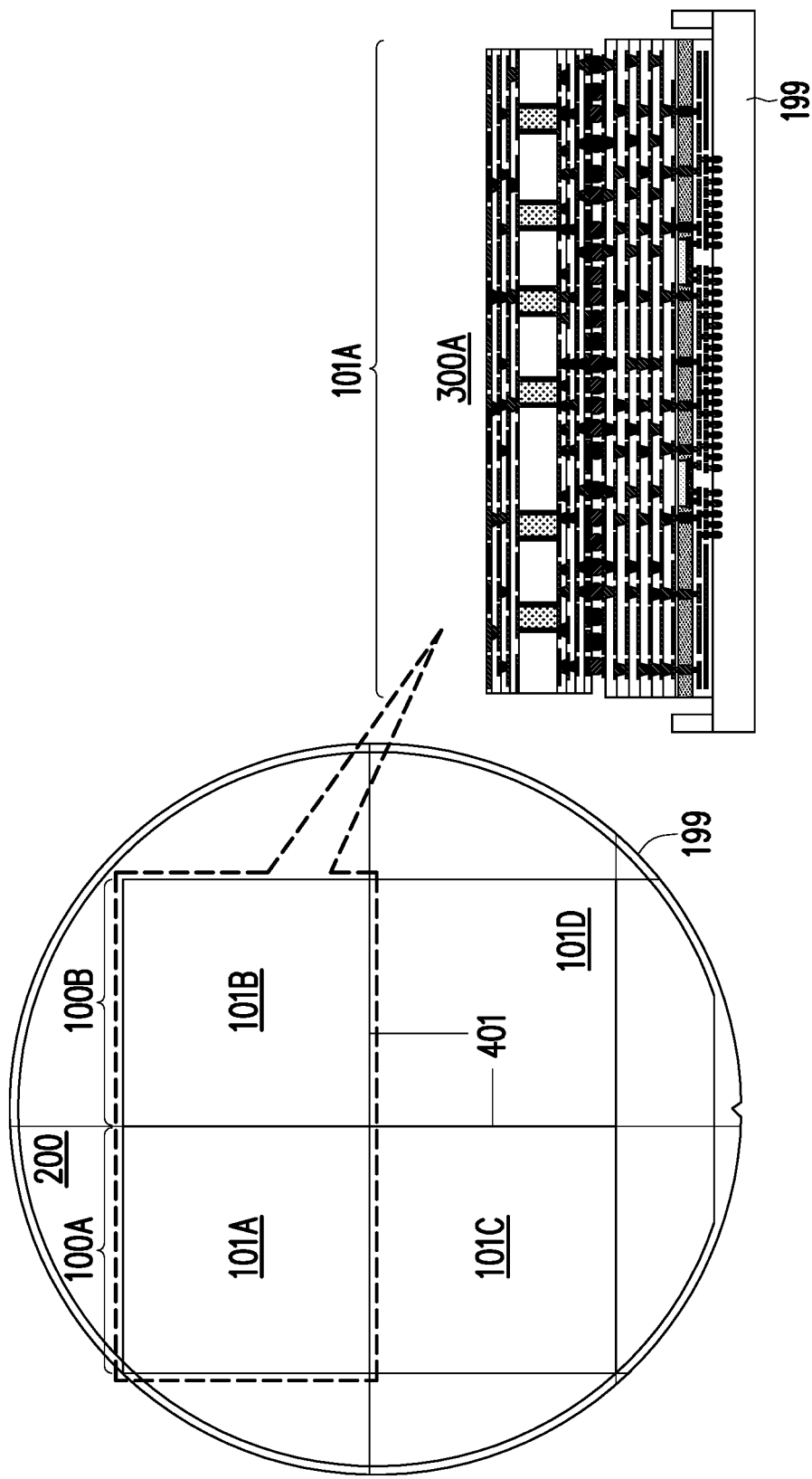
FIG. 25 illustrates a planar view of the layout of package regions on a wafer substrate in accordance with some embodiments.

As discussed above, the redistribution structure 200 may be larger and include multiple package regions, such as the first package region 101A and second package region 101B. For example, FIG. 25 illustrates the redistribution structure 200 having a circular wafer shape with multiple package regions. In the embodiment shown, four package regions 101A, 101B, 101C, and 101D are included on the wafer allowing for four final package components to be fabricated on a single wafer and later singulated. Fewer or more package regions may be utilized on a single wafer in other embodiments. Subsequent steps in the process use the redistribution structure 200 on a wafer form frame 199 as the base upon which to continue the fabrication process described in further detail below. As described in further detail below, the individual package regions are singulated by sawing along lines 401 and around the outer edges of package regions 101A, 101B, 101C, and 101D.

Figure 26:
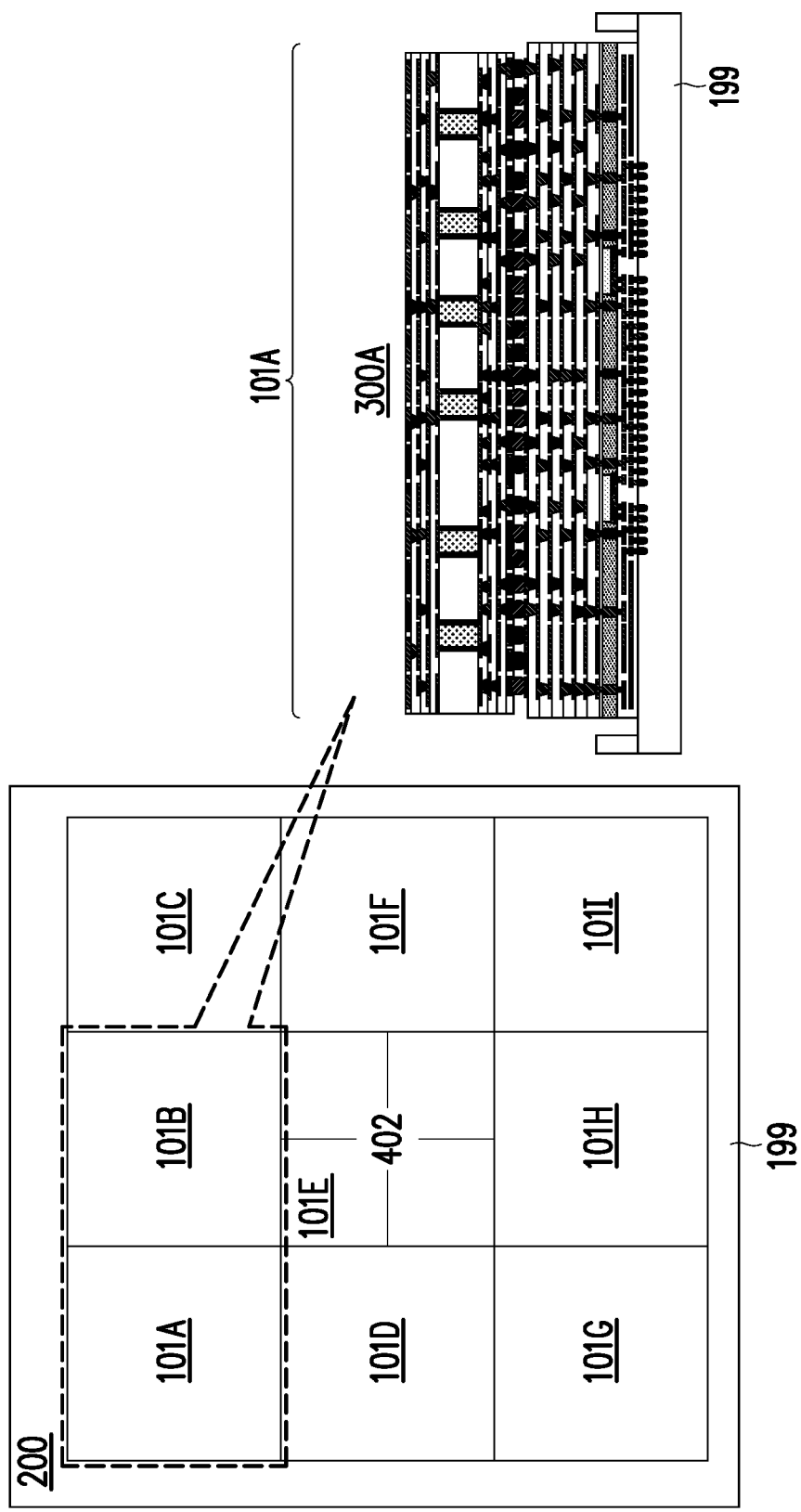
FIG. 26 illustrates a planar view of the layout of package regions on a panel substrate in accordance with some embodiments.

FIG. 26 illustrates the redistribution structure 200 being manufactured using a panel form fabrication process with multiple package regions. In the embodiment shown, nine package regions 101A through 1oII are included on the wafer allowing for nine final package components to be fabricated on a single wafer or panel. Fewer or more package regions may be utilized on a single wafer or panel in other embodiments. Subsequent steps in the process use the redistribution structure 200 on a panel form frame 199 as the base upon which to continue the fabrication process described in further detail below. As described in further detail below, the individual package regions are singulated by sawing along lines 402 and around the perimeter of package regions 101A through 1oII.

Figure 27:
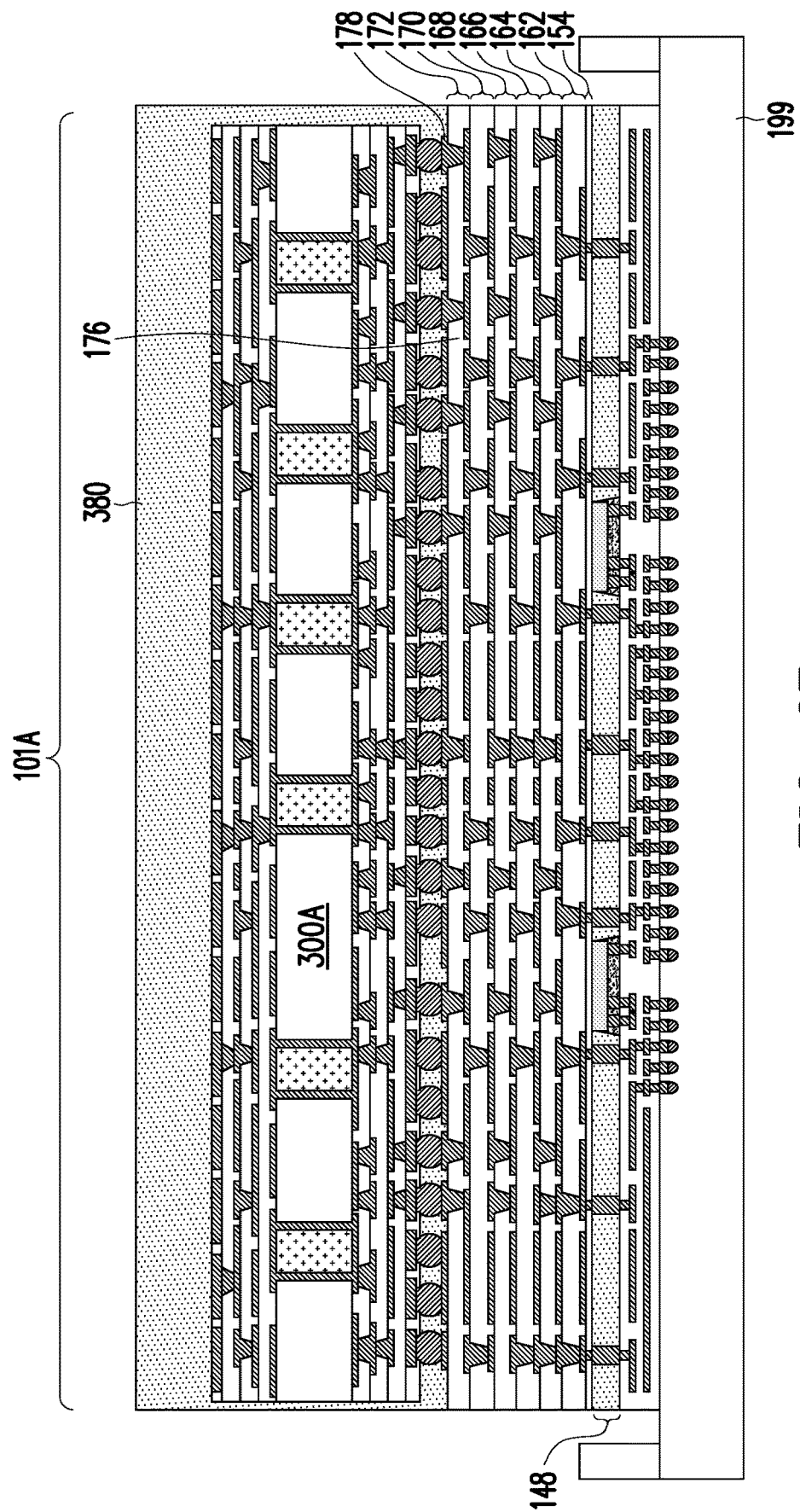

In FIG. 27, an encapsulation is performed by forming encapsulant 380 on and around the various components. After formation, the encapsulant 380 surrounds the core substrates 300A and 300B, including conductive connectors 365, metallization pattern 178, and the upper exposed surface of dielectric layer 176. The encapsulant 380 may be formed of a molding compound, epoxy, or the like, and may be applied by compression molding, transfer molding, or the like. The encapsulant 380 may be applied in liquid or semi-liquid form and then subsequently cured. The encapsulant 380 may be formed over the frame 199 such that core substrates 300A and 300B are buried or covered.

Figure 28:
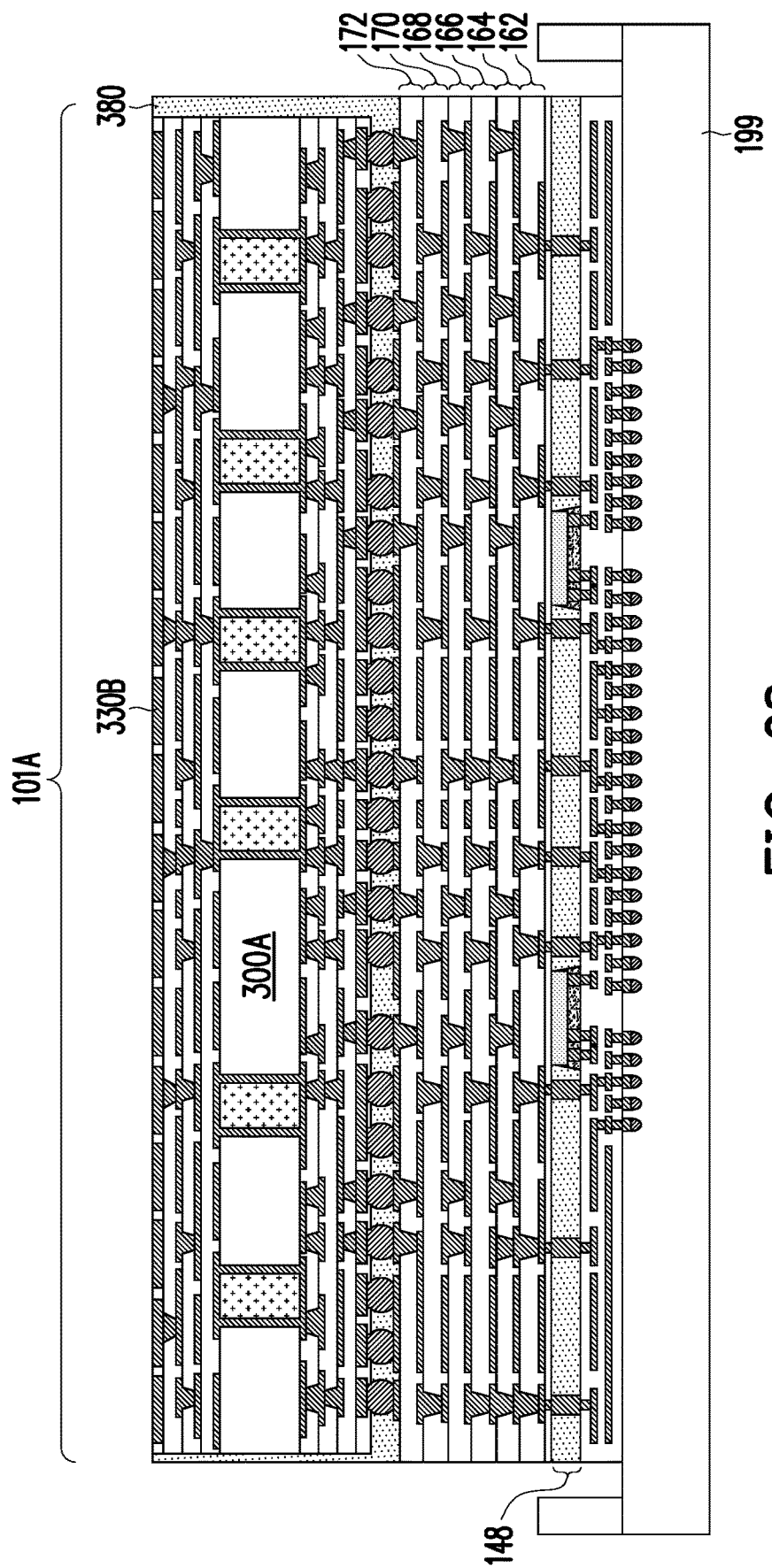

In FIG. 28, a planarization process may be performed, if necessary, on the encapsulant 380 to expose the UBMs 330B of the core substrates 300A and 300B. Topmost surfaces of the encapsulant 380 and UBMs 330B are level (e.g., planar) after the planarization process within process variations. The planarization process may be, for example, a chemical-mechanical polish (CMP), a grinding process, or the like. In some embodiments, the planarization may be omitted, for example, if the UBMs 330B are already exposed. Other processes may be used to achieve a similar result. For example, a dielectric or passivation layer may be formed over UBMs 330B prior to forming the encapsulant 380. In such cases, the dielectric or passivation layer may be patterned in a subsequent step to expose portions of the UBMs 330B.

Figure 29:
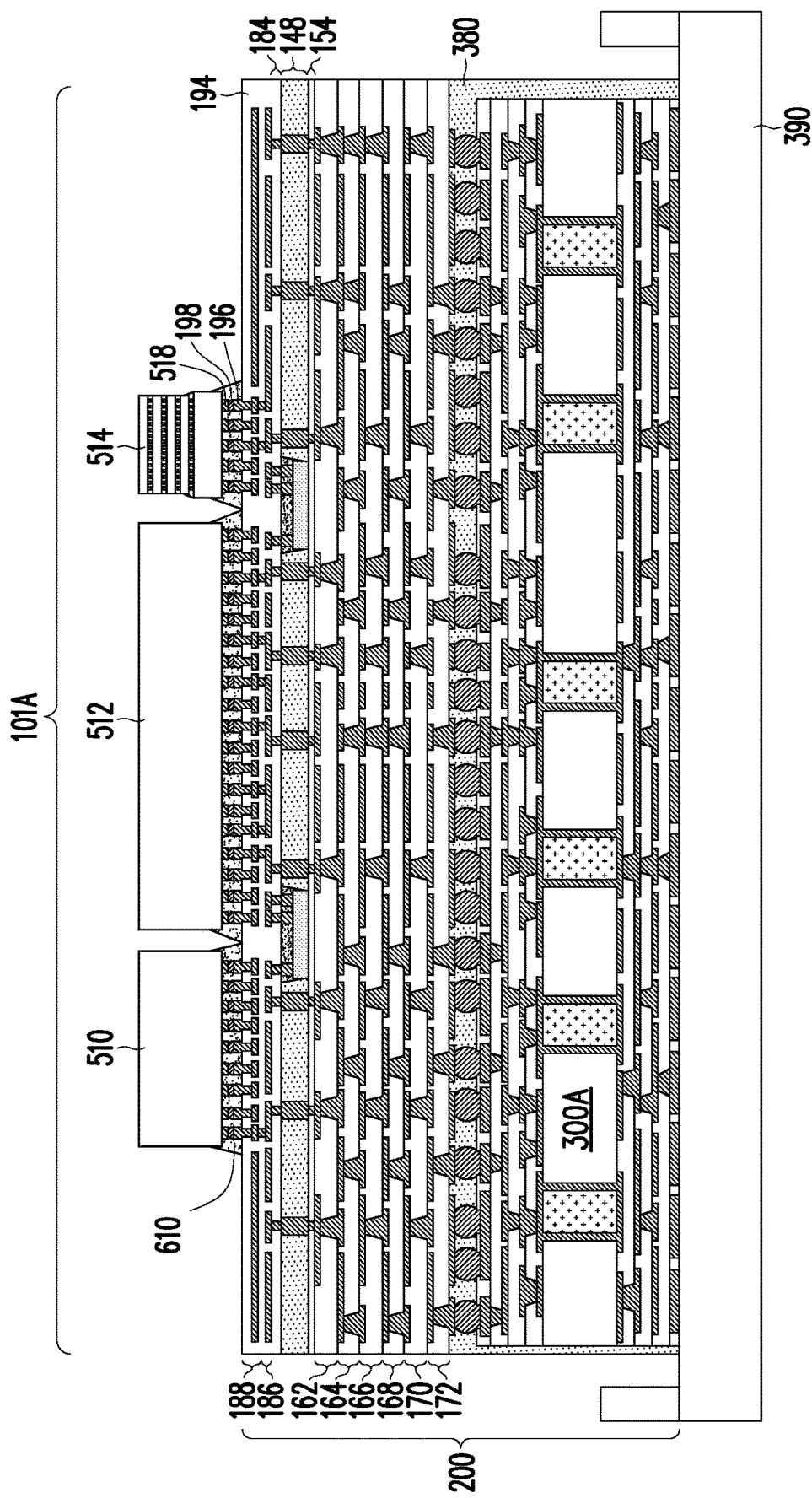

In FIG. 29, the structure is removed from the frame 199 and flipped over onto a frame 390. In some embodiments, the frames 199 and 390 are the same frame.

Further in FIG. 29, the integrated circuit package 500, as shown in FIG. 1, is attached to the redistribution structure 200 through the conductive connectors 198. The conductive connectors 198 attach the integrated circuit package 500 to the UBMs 196 and redistribution structure 200. Attaching the integrated circuit package 500 may include placing the dies 512, 514, and 516 of the integrated circuit package 500 on the conductive connectors 198 and reflowing the conductive connectors 198 to physically and electrically couple the integrated circuit package 500 and the redistribution structure 200.

In some embodiments, an underfill 610, as shown in FIG. 1, is formed surrounding the conductive connectors 198 between the integrated circuit package 500 and the redistribution structure 200. The underfill 610 may reduce stress and protect the joints resulting from the reflowing of the conductive connectors 198. The underfill 610 may be formed by a capillary flow process after the integrated circuit package 500 is attached, or may be formed by a suitable deposition method. In some embodiments, a single layer of underfill 610 is formed beneath multiple adjacent devices, and further subsequent underfills (not shown) or encapsulants (not shown) may be formed beneath and/or around additional devices placed on top of the redistribution structure 200.

Figure 30:
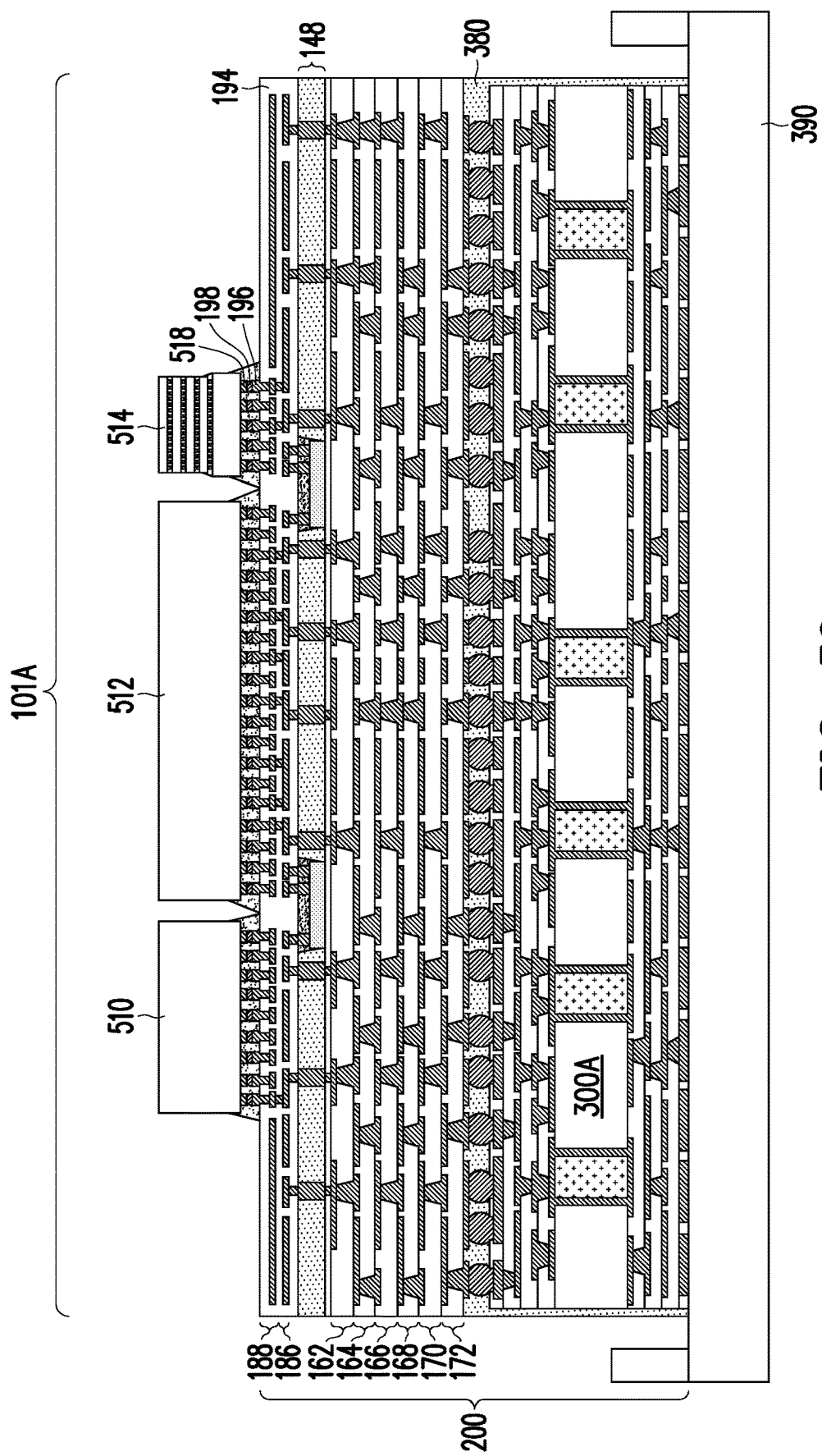

In FIG. 30, a singulation process is performed by sawing along scribe line regions, e.g., between the first package region 101A and the second package region 101B. The sawing singulates the first package region 101A from adjacent package regions, including second package region 101B (shown) to form multiple singulated package components 100. As illustrated in FIG. 30, sidewalls of the core substrate 300 are covered with the encapsulant 380, thereby protecting the sidewalls of the core substrates 300A and 300B during and after singulation.

External connectors 620, as shown in FIG. 1, are formed on the UBMs 330B of the core substrate 300. The external connectors 620 may be ball grid array (BGA) connectors, solder balls, metal pillars, controlled collapse chip connection (C4) bumps, micro bumps, or the like. The external connectors 620 may include a conductive material such as solder, copper, aluminum, gold, nickel, silver, palladium, tin, the like, or a combination thereof. In some embodiments, the external connectors 620 are formed by initially forming a layer of reflowable material on the UBMs 330 through evaporation, electroplating, printing, solder transfer, ball placement, or the like. Once a layer of reflowable material has been formed on the UBMs 330B a reflow may be performed in order to shape the material into the desired bump shapes.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments may achieve advantages. For example, the local interconnect components increase the communication bandwidth between the integrated circuit dies while maintaining low contact resistance and high reliability. The low contact resistance and high reliability is at least in part due to a solder-free connection between the embedded local interconnect component and the redistribution structure. For example, by not having a solder connection in the final structure, the electromigration issue of solder joints are eliminated. Further, the redistribution structure, the embedded local interconnect component, the core substrate, and the integrated circuit dies, may be individually fabricated and tested prior to assembling the completed package component. This further increases component and board level reliability. Because of the increased communication bandwidth between the integrated circuit dies provided by the local interconnect components, an interposer is not required between the integrated circuit dies and the redistribution structure. By removing the need for an interposer, the warpage mismatch between the integrated circuit package (including the integrated circuit dies) and the core substrate package (including the core substrate and the redistribution structure) is reduced because the coefficient of thermal expansion (CTE) mismatch between these two package structures is reduced.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
a core substrate;
a redistribution structure coupled to a first side of the core substrate, the redistribution structure comprising:
a plurality of redistribution layers, each of the plurality of redistribution layers comprising a dielectric layer and a metallization layer; and
a first local interconnect component embedded in a first redistribution layer of the plurality of redistribution layers, the first local interconnect component comprising a substrate, a backside of the substrate of the first local interconnect component being free from an adhesive layer, an interconnect structure on the substrate, and bond pads on the interconnect structure, the bond pads of the first local interconnect component physically contacting a metallization layer of a second redistribution layer, the second redistribution layer being adjacent the first redistribution layer, the metallization layer of the second redistribution layer comprising first conductive vias, the metallization layer of the first redistribution layer comprising second conductive vias spaced apart from the first local interconnect component by a distance in a range from 5 µm to 2000 µm, the dielectric layer of the first redistribution layer encapsulating the first local interconnect component, an underfill between the interconnect structure of the first local interconnect component and the second redistribution layer, the underfill being a distinct layer from the dielectric layer of the first redistribution layer, the underfill surrounding the bond pads of the first local interconnect component;
a first integrated circuit die coupled to the redistribution structure, the redistribution structure being interposed between the core substrate and the first integrated circuit die;
a second integrated circuit die coupled to the redistribution structure, the redistribution structure being interposed between the core substrate and the second integrated circuit die, the interconnect structure of the first local interconnect component electrically coupling the first integrated circuit die to the second integrated circuit die; and
a set of conductive connectors coupled to a second side of the core substrate.

2. The structure of claim 1, wherein the redistribution structure is coupled to the first side of the core substrate using first solder connections.

3. The structure of claim 1, further comprising:
an encapsulant interposed between the redistribution structure and the core substrate.

4. The structure of claim 3, wherein the encapsulant extends along sidewalls of the core substrate.

5. The structure of claim 1, wherein the first redistribution layer comprises second conductive vias extending through the dielectric layer of the first redistribution layer, the second conductive vias physically contacting the metallization layer of the second redistribution layer.

6. The structure of claim 1, wherein the interconnect structure of the first local interconnect component is on a first side of the substrate of the first local interconnect component, the first side of the first local interconnect component facing the first integrated circuit die.

7. The structure of claim 1, wherein the substrate of the first local interconnect component is a silicon substrate.

8. A package comprising:
a first side of a first redistribution structure bonded to a first side of a core substrate, the first redistribution structure comprising:
   a first set of conductive vias;
   a first set of through vias;
   a first interconnecting die between two of the first set of through vias, the first interconnecting die comprising a substrate, an interconnect structure on the substrate, and first bond pads on the interconnect structure, the first bond pads physically contacting and electrically connected to the first set of conductive via;
   a first dielectric layer laterally surrounding the first interconnecting die and the first set of through vias, the first set of conductive vias having a surface coplanar with a surface of the first dielectric layer, wherein the first dielectric layer, the first set of through vias, and the first interconnecting die comprise a first redistribution layer; and
   a second redistribution layer on the first redistribution layer, the second redistribution layer comprising a second dielectric layer and the first set of conductive vias, the first redistribution layer being nearer the first side of the core substrate than the second redistribution layer; an underfill between the first interconnecting die and the second redistribution layer, the underfill being surrounded by the first dielectric layer, the underfill being a distinct layer from the first dielectric layer; and
a first integrated circuit die and a second integrated circuit die bonded to a second side of the first redistribution structure, the second side being opposite the first side, the first integrated circuit die and the second integrated circuit die being electrically coupled to the first interconnecting die.

9. The package of claim 8, further comprising:
a first encapsulant laterally surrounding the core substrate.

10. The package of claim 8, further comprising:
   a third redistribution layer on the second redistribution layer, the third redistribution layer comprising a third dielectric layer, a second set of conductive vias, and a first set of conductive lines, the first set of conductive lines being electrically coupled to the second set of conductive vias; and
   second bond pads on the third redistribution layer, wherein the first integrated circuit die and the second integrated circuit die are bonded to the second bond pads with solder regions.

11. The package of claim 10, wherein the second dielectric layer is made of a different material than the first dielectric layer.

12. The package of claim 11, wherein the third dielectric layer is made of a same material as the second dielectric layer.

13. The package of claim 8, wherein a width of the first redistribution structure is greater than a width of the core substrate.

14. The package of claim 8, wherein the substrate of the first interconnecting die is a silicon substrate.

15. The package of claim 8, further comprising:
   a fourth dielectric layer covering a backside of the substrate of the first interconnecting die, wherein the dielectric layer is not an adhesive layer.

16. A package comprising:
   a first redistribution structure, the first redistribution structure comprising a plurality of redistribution layers, each of the plurality of redistribution layers comprising a metallization pattern and a dielectric layer, a first redistribution layer of the plurality of redistribution layers comprising a first dielectric layer, first conductive vias, a first interconnecting die, and an underfill, the first interconnecting die comprising a substrate, an interconnect structure on the substrate, and die connectors on the interconnect structure, the underfill surrounding the die connectors, the underfill being a distinct layer from the first dielectric layer, the die connectors and the first conductive vias physically and electrically contacting a metallization pattern of a second redistribution layer, the metallization pattern of the second redistribution layer comprising second conductive vias, the first dielectric layer encapsulating the first interconnecting die and the first conductive vias;
   a core substrate coupled to a first side of the first redistribution structure using a first set of conductive connectors, a width of the first redistribution structure being greater than a width of the core substrate; and
   an integrated circuit die package coupled to a second side of the first redistribution structure using a second set of conductive connectors, the second side being opposite the first side.

17. The package of claim 16, wherein the first set of conductive connectors and the second set of conductive connectors each comprise solder, and wherein the die connectors of the first interconnecting die are bonded to the metallization pattern of the second redistribution layer without solder.

18. The package of claim 16, further comprising an encapsulant interposed between the core substrate and the first redistribution structure.

19. The package of claim 16, wherein the second redistribution layer comprises a second dielectric layer, the second dielectric layer being a different material than the first dielectric layer.

20. The package of claim 16, wherein a backside of the substrate of the first interconnecting die is free from an adhesive layer.

* * * * *